United States Patent
Furuhata et al.

(10) Patent No.: US 6,429,073 B1
(45) Date of Patent: Aug. 6, 2002

(54) METHODS FOR MANUFACTURING SEMICONDUCTOR DEVICES HAVING A NON-VOLATILE MEMORY TRANSISTOR

(75) Inventors: Tomoyuki Furuhata; Atsushi Yamazaki, both of Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/602,535

(22) Filed: Jun. 23, 2000

(51) Int. Cl.[7] .......................................... H01L 21/8247
(52) U.S. Cl. .................. 438/258; 438/261; 438/266; 438/275; 438/981
(58) Field of Search ................................ 438/258, 261, 438/266, 267, 275, 591, 981

(56) References Cited

U.S. PATENT DOCUMENTS

| | | | |
|---|---|---|---|
| 4,651,406 A | 3/1987 | Shimizu et al. ................ | 29/571 |
| 5,045,488 A | 9/1991 | Yeh .............................. | 437/43 |
| 5,153,143 A | * 10/1992 | Schlais et al. ............... | 438/258 |
| 5,242,848 A | 9/1993 | Yeh .............................. | 437/43 |
| 5,278,087 A | 1/1994 | Jenq ............................ | 437/43 |
| 5,309,371 A | 5/1994 | Shikata et al. ............... | 364/491 |
| 5,378,919 A | 1/1995 | Ochiai ......................... | 257/204 |
| 5,379,253 A | 1/1995 | Bergemont .................. | 365/185 |
| 5,572,054 A | 11/1996 | Wang et al. ................. | 257/322 |

(List continued on next page.)

FOREIGN PATENT DOCUMENTS

| | | | | |
|---|---|---|---|---|
| JP | 3-219496 | 9/1991 | .......... | G11C/16/06 |
| JP | 7-142617 | 6/1995 | ....... | H01L/21/8247 |
| JP | 7-147336 | 6/1995 | ....... | H01L/21/8247 |
| JP | 9-321156 | 12/1997 | ....... | H01L/21/8247 |
| JP | 9-321157 | 12/1997 | ....... | H01L/21/8247 |
| JP | 11-074389 | 3/1999 | ....... | H01L/21/8247 |
| JP | 2000-188344 | 7/2000 | ....... | H01L/21/8247 |

OTHER PUBLICATIONS

U.S. Serial No. 09/604,702 (filed Jun. 23, 2000).
U.S. Serial No. 09/602,766 (filed Jun. 23, 2000).
U.S. Serial No. 09/599,477 (filed Jun. 23, 2000).

*Primary Examiner*—Chandra Chaudhari
(74) *Attorney, Agent, or Firm*—Konrad Raynes Victor & Mann, LLP; Alan S. Raynes

(57) ABSTRACT

Embodiments include a method for manufacturing a semiconductor device including a plurality of non-volatile memory transistors that include field effect transistors operated at a plurality of different voltage levels. The method includes the following steps: (a) forming a gate insulation layer 26 and a floating gate 40 of a non-volatile memory transistor 400 on a silicon substrate 10 in a memory region 4000; (b) forming, on the wafer, a first silicon oxide layer 50*a*L by a thermal oxidation method and a second silicon oxide layer 50*b*L by a CVD method; (c) removing the first and the second silicon oxide layers in the first transistor region; and (d) forming a silicon oxide layer 20L on the wafer by a thermal oxidation method. The silicon oxide layer formed in step (d) compose at least a portion of a gate insulation layer of a first voltage-type transistor and a gate insulation layer of a second voltage-type transistor.

30 Claims, 15 Drawing Sheets

U.S. PATENT DOCUMENTS

| | | | |
|---|---|---|---|
| 5,604,150 A | 2/1997 | Mehrad | 437/70 |
| 5,650,344 A | 7/1997 | Ito et al. | 437/40 |
| 5,652,450 A | 7/1997 | Hirano | 257/323 |
| 5,654,577 A | 8/1997 | Nakamura et al. | 257/392 |
| 5,674,762 A | 10/1997 | See et al. | 437/31 |
| 5,687,118 A | 11/1997 | Chang | 365/185.19 |
| 5,712,178 A | 1/1998 | Cho et al. | 437/43 |
| 5,748,536 A | 5/1998 | Kwon et al. | 365/185.25 |
| 5,907,172 A | 5/1999 | Sheu | 257/317 |
| 5,908,311 A | 6/1999 | Chi et al. | 438/258 |
| 5,914,514 A | 6/1999 | Dejenfelt et al. | 257/322 |
| 5,939,749 A * | 8/1999 | Taketa et al. | 257/316 |
| 5,969,383 A * | 10/1999 | Chang et al. | 257/316 |
| 6,004,847 A * | 12/1999 | Clementi et al. | 438/258 |
| 6,017,795 A | 1/2000 | Hsieh et al. | 438/262 |
| 6,043,123 A | 3/2000 | Wang et al. | 438/258 |
| 6,103,573 A | 8/2000 | Harari et al. | 438/257 |
| 6,144,064 A | 11/2000 | Cho et al. | 257/321 |
| 6,157,060 A | 12/2000 | Kerber | 257/316 |
| 6,184,093 B1 * | 2/2001 | Sung | 438/275 |
| 6,194,269 B1 | 2/2001 | Sung et al. | 438/258 |
| 6,242,773 B1 | 6/2001 | Thomas | 257/315 |

* cited by examiner

METHODS FOR MANUFACTURING SEMICONDUCTOR DEVICES HAVING A NON-VOLATILE MEMORY TRANSISTOR

The copending and commonly assigned patent application No. 09/604,702 entitled "Semiconductor Devices Having a Non-Volatile Memory Transistor", with Tomoyuki Furuhata and Atsushi Yamazaki listed as inventors, is hereby incorporated by reference in its entirety. The copending and commonly assigned patent application No. 09/602,766 entitled "Non-Volatile Semiconductor Memory Devices", with Tomoyuki Furuhata and Atsushi Yamazaki listed as inventors, is hereby incorporated by reference in its entirety. Japanese patent application no. 11-177147, filed Jun. 23, 1999, is hereby incorporated by reference in its entirety.

TECHNICAL FIELD

The present invention relates to methods for manufacturing semiconductor devices having a non-volatile memory transistor with a split-gate structure and includes a semiconductor device comprising a plurality of field effect transistors having different operation voltages.

BACKGROUND

In recent years, a mixed-mounting of various circuits has been utilized in view of various demands such as a shortened chip-interface delay, a lowered cost per circuit board, a lowered cost in design and development of a circuit board and the like. A mixed-mounting technology for mounting memory and logic has become one of the important technologies. However, such a mixed-mounting technology presents problems that result in complex processes and higher costs for manufacturing ICs.

SUMMARY

One embodiment of the present invention relates to a method for manufacturing a semiconductor device including a memory region, first, second and third transistor regions including field effect transistors that operate at different voltage levels, wherein the memory region includes a split-gate non-volatile memory transistor, the first transistor region includes a first voltage-type transistor that operates at a first voltage level, the second transistor region includes a second voltage-type transistor that operates at a second voltage level, and the third transistor region includes a third voltage-type transistor that operates at a third voltage level. The method for manufacturing the semiconductor device includes the steps of: (a) forming a gate insulation layer and a floating gate that compose a portion of the non-volatile memory transistor on a silicon substrate in the memory region; (b) forming a first silicon oxide layer on the silicon substrate by a thermal oxidation method, and a second silicon oxide layer by a CVD method; (c) forming a mask layer defining an opening in the first transistor region, and removing the first and the second silicon oxide layers in the first transistor region; (d) forming a silicon oxide layer on the wafer by a thermal oxidation method for gate insulation layers of at least the first voltage-type transistor and second voltage-type transistor; (e) forming a conductive layer and thereafter conducting a patterning to form an intermediate insulation layer and a control gate of the non-volatile memory transistor and a gate insulation layer and a gate electrode for each of the transistors in the transistor regions; and (f) forming an impurity diffusion region that forms a source or a drain by doping an N-type impurity or a P-type impurity in a predetermined region of the silicon substrate.

The silicon oxide layer formed in the step (d) forms at least part of a gate insulation layer of the first voltage-type transistor and a gate insulation layer of the second voltage-type transistor.

Another embodiment relates to a method for manufacturing a semiconductor device including forming a gate insulation layer and a floating gate that compose a portion of a non-volatile memory transistor on a silicon substrate in a memory region. A first silicon oxide layer is formed on the substrate by a thermal oxidation method and a second silicon oxide layer by a CVD method. A mask layer defining an opening in a first transistor region is formed, and the first and the second silicon oxide layers in the first transistor region are removed while leaving at least one of the first and second silicon oxide layers remaining in a second transistor region. A silicon oxide layer is formed on the substrate by a thermal oxidation method to form at least a portion of a gate insulation layer of at least the first voltage-type transistor and a second voltage-type transistor. A conductive layer is formed and etched the conductive layer to define an intermediate insulation layer and a control gate of the non-volatile memory transistor and a gate insulation layer and a gate electrode for the first voltage-type transistor and second voltage-type transistor in the transistor region. In addition, an impurity diffusion region that forms a source or a drain is created by doping an N-type impurity or a P-type impurity in a predetermined region of the silicon substrate. The silicon oxide layer formed on the substrate by a thermal oxide method forms at least part of a gate insulation layer of the first voltage-type transistor and a gate insulation layer of the second voltage-type transistor.

Another embodiment relates to method for forming a device including non-volatile semiconductor memory region with a split-gate structure. The method includes forming a source and drain in a substrate. A gate insulation layer is formed, and a floating gate is formed in contact with said gate insulation layer. An intermediate insulation layer is formed in contact with a portion of said floating gate, the intermediate insulation layer being adapted to function as a tunnel insulation layer. The intermediate insulation layer is formed from at least three insulation layers including a first layer that contacts the floating gate, a second layer, and a third layer that contacts a control gate. The control gate is formed in contact with the third layer of the intermediate insulation layer. The intermediate insulation layer and the control gate are formed to have a split-gate structure.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION

Figure 1:
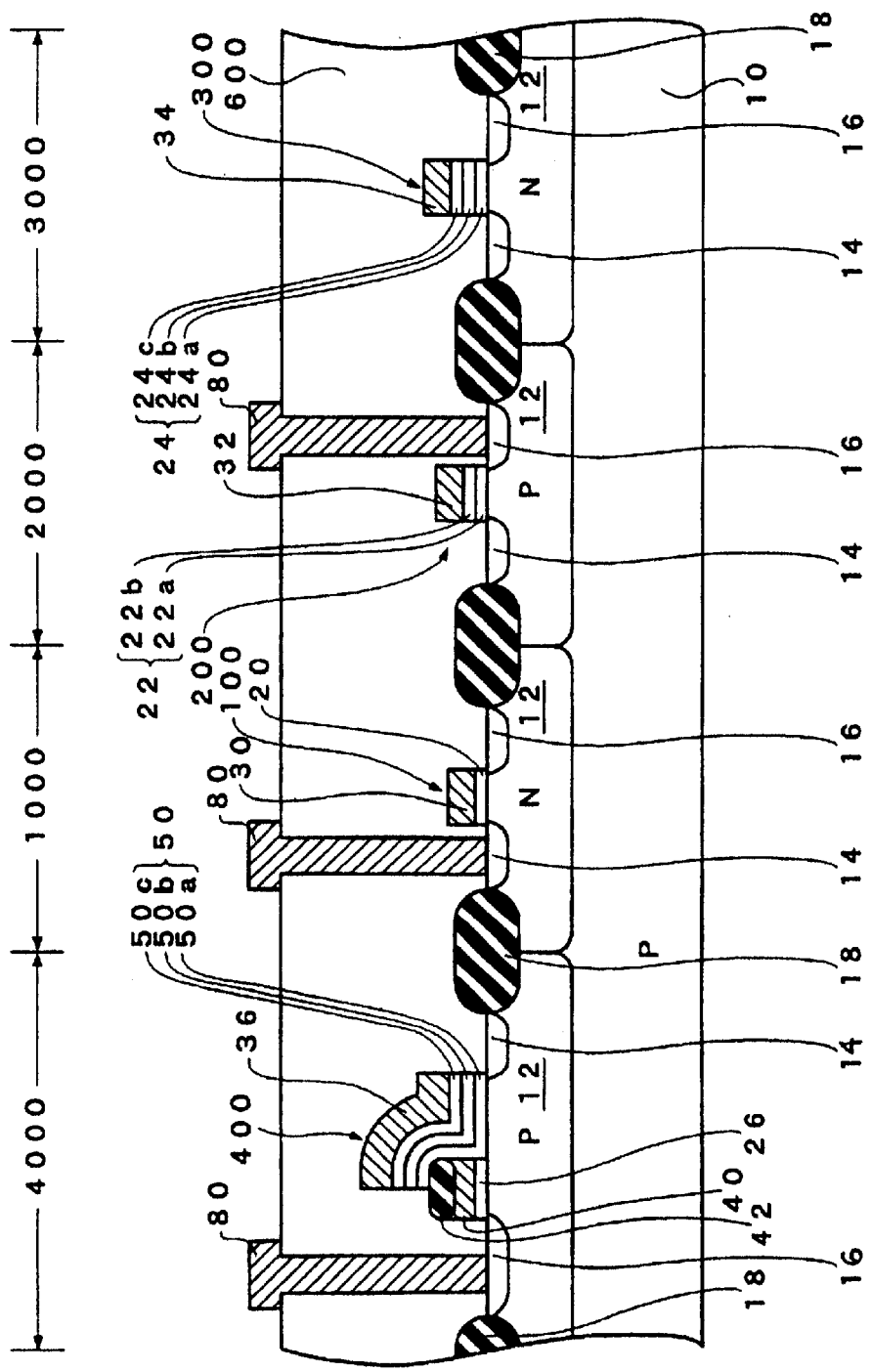
FIG. 1 is a schematic cross-sectional view of a semiconductor device in accordance with the present invention.

Certain embodiments of the present invention relate to methods for manufacturing a semiconductor device having highly reliable non-volatile memory transistors including field effect transistors that are operated at a plurality of different voltage levels, in which gate insulation layers of the transistors are formed by fewer and common manufacturing steps.

Embodiments of the present invention include methods for manufacturing a semiconductor device having a non-volatile memory transistor, wherein the semiconductor device comprises a memory region, first, second and third transistor regions including field effect transistors that operate at different voltage levels. The memory region includes a split-gate non-volatile memory transistor. The first transistor region includes a first voltage-type transistor that operates at a first voltage level. The second transistor region includes a second voltage-type transistor that operates at a second voltage level. The third transistor region includes a third voltage-type transistor that operates at a third voltage level.

One method for manufacturing the semiconductor device described above comprises the steps of:

(a) forming a gate insulation layer and a floating gate that compose the non-volatile memory transistor on a silicon substrate in the memory region;

(b) forming a first silicon oxide layer on a wafer by a thermal oxidation method, and a second silicon oxide layer by a CVD method;

(c) forming a mask layer defining an opening in the first transistor region, and removing the first and the second silicon oxide layers in the first transistor region;

(d) forming a silicon oxide layer on the wafer by a thermal oxidation method for gate insulation layers of at least the first and the second voltage-type transistors;

(e) forming a conductive layer that is to form a gate insulation layer on the wafer, and thereafter conducting a patterning to form an intermediate insulation layer and a control gate of the non-volatile memory transistor and a gate insulation layer and a gate electrode for each of the transistors in the transistor regions; and (f) forming an impurity diffusion region that forms a source or a drain by doping an N-type impurity or a P-type impurity in a predetermined region of the silicon substrate;

wherein the silicon oxide layer formed in the step (d) forms at least part of a gate insulation layer of the first voltage-type transistor and a gate insulation layer of the second voltage-type transistor.

According to the method described above, the gate insulation layers of at least two of the transistors are formed by a common process. Accordingly, the non-volatile memory transistor and the first through the third voltage-type transistors having different operation voltages are formed with fewer manufacturing steps in the memory region and the first through the third transistor regions, respectively.

Also, the semiconductor device has the first through the third voltage-type transistors that operate at at least three different voltage levels, namely, the first through the third voltage levels. Therefore, logic that can be operated at these voltage levels can be mounted in the semiconductor device. Because of the voltage-type transistors, logic that may be required for the operation of the non-volatile memory transistors as well as other circuit regions can be mixed and mounted.

The following steps (g) and (h) may preferably be further included before the step (c):

the step (g) of forming a mask layer defining an opening in the second transistor region, and removing the first and the second silicon oxide layers in the second transistor region; and the step (h) of forming a silicon oxide layer on the wafer by a thermal oxidation method for a gate insulation layer of the second voltage-type transistor.

By conducting the steps (g) and (h), the gate insulation layer of the second voltage-type transistor is formed from at least two layers, wherein one of the layers is composed of a silicon oxide layer that is formed in the step (d) in which the gate insulation layer of the first voltage-type transistor is formed, and the other layer is composed of a silicon oxide layer that is formed in the step (h).

In addition, the gate insulation layer of the third voltage-type transistor may preferably be formed from at least three layers, and preferably includes a silicon oxide layer that is formed in the step (d) in which the gate insulation layer of the first voltage-type transistor is formed. As a result, the gate insulation layers of the second and the third voltage-type transistors include an insulation layer that is formed in the step in which the gate insulation layer of the first voltage-type transistor is formed. This further reduces the number of manufacturing steps.

The split-gate type non-volatile memory transistor may includes a source, a drain, a gate insulation layer, a floating gate, an intermediate insulation layer that functions as a tunnel insulation layer and a control gate. The intermediate insulation layer may preferably be formed from at least three layers, and preferably includes first and second outermost layers that respectively contact the floating gate and the control gate, wherein the outermost layers are composed of silicon oxide layers that are formed by a thermal oxidation method. Because the outermost layers contact the floating gate and the control gate, the respective interface states stabilize. As a result, electric an electric charge is smoothly transferred by the FN conduction (Fowler-Nordheim tunneling), and thus the operation of the non-volatile memory transistor stabilizes.

The second outermost layer of the intermediate insulation layer that contacts the control gate may preferably be composed of the silicon oxide layer that is formed in the step (d) in which the gate insulation layer of the first voltage-type transistor is formed. Also, the first outermost layer of the intermediate insulation layer that contacts the floating gate may preferably be composed of the silicon oxide layer that is formed in the step (b) in which the gate insulation layer of the third voltage-type transistor is formed. In this manner, since these layers are formed by common steps, the number of manufacturing steps is further reduced.

The gate insulation layer of the third voltage-type transistor may preferably be formed in the same step in which the intermediate insulation layer of the non-volatile memory transistor is formed. As a result, the number of manufacturing steps is further reduced.

After the step (b), a step (i) may preferably be conducted to form an insulation layer other than a silicon oxide layer, such as an insulation layer composed of a silicon nitride layer, on the second silicon oxide layer. The insulation layer formed in the step (i) may preferably be removed before the step (c). By providing an insulation layer such as a silicon nitride on the second silicon oxide layer in the step (i), the film thickness of the intermediate insulation layer of the non-volatile memory transistor and the gate insulation layer of the third voltage-type transistor does not become unnecessarily thick, and the film thickness of these insulation layers can be precisely controlled. Also, since the silicon nitride layer is formed on the silicon oxide layer in the step (i), the silicon oxide layer is protected by the silicon nitride layer, when a thermal oxidation is conducted in a later stage or when a cleaning step is conducted before or after the thermal oxidation. As a result, effects of the thermal oxidation step and the cleaning step over the silicon oxide layer are controlled. As a consequence, a tunnel insulation layer with an excellent film characteristic can be obtained, and highly reliable memory characteristics can be obtained. Further, when a heat treatment (including a heat treatment in an oxidation process) is conducted at, for example, 700° C.–1000° C., with the silicon nitride layer being formed on the silicon oxide layer in the step (i), the silicon oxide layer further densifies and the film quality of the silicon oxide layer improves. As a consequence, the memory characteristics, in particular, the number of data writing and erasing operations (cycle life) can be extended.

The film thickness of the gate insulation layer of each of the voltage-type transistors may preferably be in the following ranges, in consideration of the dielectric strength of the voltage-type transistors: The gate insulation layer of the first voltage-type transistor may preferably have a film thickness of 3–13 nm. The gate insulation layer of the second voltage-type transistor may preferably have a film thickness of 4–15 nm. The gate insulation layer of the third voltage-type transistor may preferably have a film thickness of 16–45 nm.

The intermediate insulation layer of the non-volatile memory transistor may preferably have a film thickness of 16–45 nm. Further, the first outermost layer that forms the intermediate insulation layer of the non-volatile memory transistor may preferably have a film thickness of 5–15 nm, and the second outermost layer may preferably have a film thickness of 1–10 nm.

Each of the voltage-type transistors may preferably be operated at a voltage level in the following ranges:

The first voltage level that operates the first voltage-type transistor is at an absolute value of 1.8–3.3 V, the second voltage level that operates the second voltage-type transistor is at an absolute value of 2.5–5 V, and the third voltage level that operates the third voltage-type transistor is at an absolute value of 10–15 V.

A semiconductor device obtained by the manufacturing method certain embodiments of the present invention may further comprise a flash-memory (flash EEPROM), and include a memory cell array of non-volatile memory transistors and a peripheral circuit formed therein. Also, the semiconductor device may further be mixed with other circuit regions such as logic mounted therein.

The circuit regions include, for example, cell-base circuits, memory circuits including ROMs and RAMs, RISC (reduced instruction set computer), IP (intellectual property) macros, and analog circuits.

The first voltage-type may, for example, be included in at least one circuit selected from a group consisting of a Y-gate, a sense amplifier, an input/output buffer, an X-address decoder, a Y-address decoder, an address buffer and a control circuit.

The second voltage-type transistor may, for example, be included in at least one circuit selected from a group consisting of a Y-gate, a sense amplifier, an input/output buffer, an X-address decoder, a Y-address decoder and an interface circuit.

The third voltage-type transistor may, for example, be included in at least one circuit selected from a group consisting of a voltage generation circuit, an erase voltage generation circuit and a step-up voltage circuit.

FIG. 1 schematically shows a cross-sectional view of a semiconductor device including a non-volatile memory transistor in accordance with an embodiment of the present invention. The semiconductor device includes a memory region 4000, a first transistor region 1000, a second transistor region 2000 and a third transistor region 3000.

The memory region 4000 includes a non-volatile memory transistor with a split-gate structure (hereinafter referred to as "memory transistor") 400. The first transistor region 1000 includes a first voltage-type transistor 100 that operates at a first voltage level V1 (preferably 1.8–3.3 V in an absolute value). The second transistor region 2000 includes a second voltage-type transistor 200 that operates at a second voltage level V2 (preferably 2.5–5 V in an absolute value). The third transistor region 3000 includes a third voltage-type transistor 300 that operates at a third voltage level V3 (preferably 10–15 V in an absolute value). Embodiments of circuits that use the first through the third voltage-type transistors 100, 200 and 300 will be described below.

The memory transistor 400, the first voltage-type transistor 100, the second voltage-type transistor 200 and the third voltage-type transistor 300 are respectively formed in wells 12 that are formed in a P-type silicon substrate 10. The memory region 4000 and the first through the third transistor regions 1000, 2000 and 3000 are respectively isolated from one another by field insulation layers 18. Also, the transistors in the respective regions 1000 through 4000 are isolated by field insulation layers (not shown) formed in predetermined patterns. In the embodiment shown in the figure, each of the transistors is formed in each of the wells. However, when wells are not required, they may be formed in the substrate. For example, in certain embodiments, N-channel type memory transistors or N-channel type second voltage-type transistors may be formed in the substrate, but not in wells.

The first through the third transistor regions 1000, 2000 ad 3000 and the memory region 4000 may respectively include N-channel type or P-channel type transistors. However, for the simplicity of description, FIG. 1 shows transistors of either one of the conductivity types.

The memory transistor 400 has a source 16 and a drain 14 composed of $N^+$ type impurity diffusion layers formed in a P-type well 12, and a gate insulation layer 26 formed on the surface of the well 12. A floating gate 40, an intermediate insulation layer 50 and a control gate 36 are formed on the gate insulation layer 26.

Further, a selective oxide insulation layer 42 is formed on the floating gate 40. The selective oxide insulation layer 42 is formed by selective oxidation on a part of a polycrystal silicon layer that becomes the floating gate, as described below, and has a structure in which the thickness thereof becomes thinner from its center toward its end section. As a result, upper edge sections of the floating gate 40 form sharp edges, such that an electric field concentration is apt to occur at the upper edges of the floating gate 40.

The thickness of the gate insulation layer 26 of the memory transistor 400 is preferably be 6–9 nm, in consideration of the dielectric strength of the memory transistor 400.

The intermediate insulation layer 50 continues from the top surface of the selective oxide insulation film 42 to the side surface of the floating gate 40, further extends along the surface of the silicon substrate 10 and reaches one end of the source 16. The intermediate insulation layer 50 functions as what is referred to as a tunnel insulation layer. Further, the intermediate insulation layer 50 is composed of three insulation layers (silicon oxide layers), which are, in the order from the bottom, a first insulation layer 50a, a second insulation layer 50b and a third insulation layer 50c. The first and the third insulation layers 50a and 50c are composed of silicon oxide layers that are formed by a thermal oxidation method. The second insulation layer 50b is composed of a silicon oxide layer that is formed by a CVD method.

The intermediate insulation layer 50 may preferably have a film thickness of 16–45 nm, in consideration of its function as a tunnel insulation layer. The first insulation layer 50a may preferably have a film thickness of 5–15 nm, the second intermediate insulation layer 50b may preferably have a film thickness of 10–20 nm, and the third insulation layer 50c may preferably have a film thickness of 1–10 nm.

The intermediate insulation layer 50 that functions as a tunnel insulation layer has a three-layer structure, and the first insulation layer (a first outermost layer) 50a and the third insulation layer (a second outermost layer) 50c are preferably formed from thermal oxidation films. As a result, the interface state between the floating gate 40 and the first insulation layer 50a stabilizes, and the interface state between the control gate 36 and the third insulation layer 50c stabilizes. As a consequence, the transfer of the charge by the FN conduction from the floating gate 40 through the intermediate insulation layer 50 to the control gate 36 becomes stable, and thus the operation of the memory transistor 400 stabilizes. This greatly contributes to an increase in the number of data writing/erasing operations (cycle life) of the memory transistor 400.

Also, because the intermediate insulation layer 50 has the second insulation layer 50b that is composed of a silicon oxide layer formed by a CVD method, the dielectric strength between the floating gate 40 and the control gate 36 increases. Also, malfunctions that may occur at the time of writing in or reading from memory cells, namely, write disturbs and read disturbs, can be inhibited.

The first voltage-type transistor 100, when it is a P-channel type MOS transistor, for example, has a source 16 and a drain 14 that are composed of $P^+$ type impurity diffusion layers which are formed in the N-type well 12, a first gate insulation layer 20 and a first gate electrode 30. The first voltage-type transistor 100 is driven at a first voltage level V1 (preferably 1.8–3.3 V in an absolute value). The first gate insulation layer 20 may preferably have a film thickness of 3–13 nm, in consideration of the dielectric strength of the first voltage-type transistor 100.

The second voltage-type transistor 200, when it is an N-channel type MOS transistor, for example, has a source 16 and a drain 14 that are composed of $N^+$ type impurity diffusion layers which are formed in the P-type well 12, a second gate insulation layer 22 and a second gate electrode 32. The second gate insulation layer 22 is composed of two silicon oxide layers, namely, a first insulation layer 22a and a second insulation layer 22b. The second insulation layer 22b is formed in the same step in which the first gate insulation layer 20 of the above-described first voltage-type transistor 100 is formed.

The second voltage-type transistor 200 is driven at a second voltage level (preferably 2.5–5 V in an absolute value). The second gate insulation layer 22 may preferably have a film thickness of 4–15 nm, in consideration of the dielectric strength of the second voltage-type transistor 200. Also, the thickness of the first insulation layer 22a may preferably be 3–15 nm, and the thickness of the second insulation layer 22b may preferably be 1–10 nm.

The third voltage-type transistor 300, when it is a P-channel type MOS transistor, for example, has a source 16 and a drain 14 that are composed of $P^+$ type impurity diffusion layers which are formed in the N-type well 12, a third gate insulation layer 24 and a third gate electrode 34. The third gate insulation layer 24 is formed from three silicon oxide layers, which are, in the order from the bottom, a first insulation layer 24a, a second insulation layer 24b and a third insulation layer 24c. The insulation layers 24a, 24b and 24c may preferably be formed in the same steps in which the first insulation layer 50a, the second insulation layer 50b and the third insulation layer 50c that form the intermediate insulation layer 50 of the memory transistor 400 are formed.

The third voltage-type transistor 300 is driven at a third voltage level V3 (preferably 10–15 V in an absolute value). The third gate insulation layer 24 may preferably have a film thickness of 16–45 nm, in consideration of the dielectric strength of the third voltage-type transistor 300. The first insulation layer 24a may preferably have a film thickness of 5–15 nm, the second insulation layer 24b may preferably have a film thickness of 10–20 nm, and the third insulation layer 24c may preferably have a film thickness of 1–10 nm.

An interlayer dielectric layer 600 is formed on the wafer in which the memory transistor 400 and the first through the third voltage-type transistors 100, 200 and 300 are formed. The interlayer dielectric layer 600 defines contact holes that reach the sources 16, the drains 14 and the gate electrode of each of the transistors 100, 200, 300 and 400. Contact conductive layers are formed in the contact holes. A wiring layer 80 having a predetermined pattern is formed on the interlayer dielectric layer 600. It is noted that FIG. 1 shows the contact conductive layers and wiring layers in part.

This semiconductor device has at least first through the third transistor regions 1000, 2000 and 3000 in which first through third voltage-type transistors 100, 200 and 300 that operate at three different voltage levels (V1, V2 and V3) are formed, respectively. According to this semiconductor device, the memory transistor 400 in the memory region 4000 can be operated. In the semiconductor device, not only logic for operating a flash EEPROM can be implemented, but also a flash EEPROM and other circuits that are operational at different voltage levels may be mixed and implemented in the same substrate to construct a system LSI. Such circuits include interface circuits, gate array circuits, memory circuits such as RAMs and ROMs and RISCs (reduced instruction set computer), or a variety of IP (Intellectual Property) macro circuits, or other digital circuits and analog circuits.

Methods for operating a memory transistor, an embedded semiconductor device in which a semiconductor device according to embodiments of the present invention is applied, and a methods for manufacturing a semiconductor device such as that shown in FIG. 1 will be described below.

For the operation of a semiconductor device including a memory transistor with a split-gate structure 400 in accordance with one embodiment, a channel current flows between the source 16 and the drain 14 to thereby inject a charge (hot electrons) in the floating gate 40 when data is written. When data is erased, a predetermined high voltage is applied to the control gate 36 to thereby transfer the charge stored in the floating gate 42 to the control gate 36 by the FN conduction. Each of the operations will be described below.

First, an example of a data-writing operation will be described For the data-writing operation, the source 16 is set at a higher potential with respect to the drain 14, and a low potential is applied to the control gate 36. As a result, hot electrons that are generated under the floating gate 40 and near the drain 14 are accelerated toward the floating gate 40, and injected in the floating gate 40 through the gate insulation layer 26 to thereby accomplish the write data operation.

In the data-writing operation, for example, the control gate 36 is set at a potential (Vc) of 2 V, the source is set at a potential (Vs) of 9 V, and the drain 14 is set at a potential (Vd) of 0 V. The well 12 is set at a potential (Vwell) of 0 V.

Next, an example of a data-erasing operation will be described. For the data-erasing operation, the control gate 36 is set at a potential higher than the potential of the source 16 and the drain 14. As a result, the charge stored in the floating gate 40 is discharged from the sharp upper edge section of the floating gate 40, passing through the intermediate insulation layer 50, to the control gate 36, whereby the data is erased.

In the data-erasing operation, for example, the control gate 36 is set at a potential (Vc) of 12 V, the source 16 and the drain 14 are set at potentials (Vs) and (Vd) of 0 V. The well 12 is set at a potential (Vwell) of 0 V.

Next, an example of a data-writing operation will be described. For the data-writing operation, the drain 14 is set at a higher potential than the source 16, and the control gate 36 is applied with a predetermined potential, whereby a determination is made whether or not data is written based on the presence or the absence of a formed channel. More specifically, when a charge is injected in the floating gate 40, the potential of the floating gate 40 becomes low, with the result that a channel is not formed and a drain current does not flow. On the other hand, when the floating gate 40 is not injected with a charge, the floating gate 40 has a high potential, with the result that a channel is formed and a drain current flows. By detecting a current flowing from the drain 14 by a sense amplifier, data in the memory transistor 400 can be read out.

In the data-reading operation, for example, the control gate 36 is set at a potential (Vc) of 3 V, the source 16 is set at a potential (Vs) of 0 V, and the drain 14 are set at a potential (Vd) of 2 V. The well 12 is set at a potential (Vwell) of 0 V.

The operations described above are examples, and other operation conditions are also applicable in accordance with other embodiments. For example, Table 1 below sets forth a range of voltages according to one embodiment for write, erase and read operations.

TABLE 1

Range of voltages for write, erase and read operations according to one embodiment.

|  | control gate (V) | source (V) | drain (V) |
| --- | --- | --- | --- |
| write | 0.5–3 | 8–11 | 0 |
| erase | 10–14 | 0 | 0 |
| read | 1–5 | 0 | 1–5 |

Figure 14:
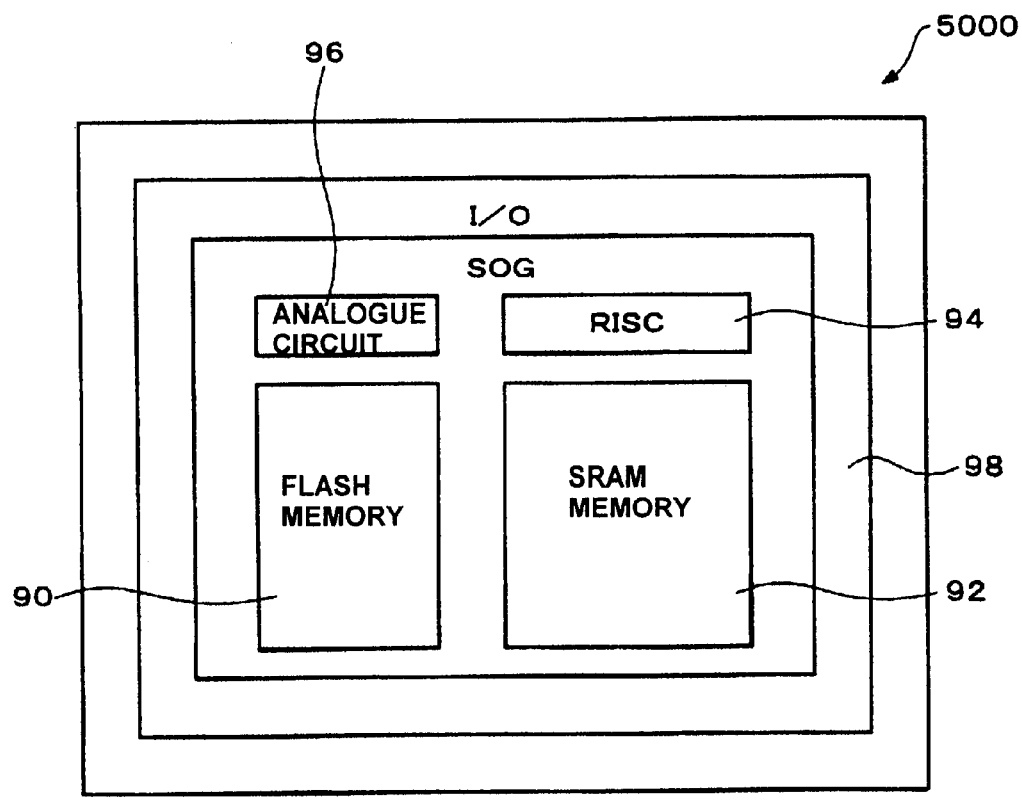
FIG. 14 is a schematic plan view of an embedded semiconductor device employing a semiconductor device in accordance with one embodiment of the present invention.

FIG. 14 schematically shows a layout of an embedded semiconductor device 5000 in which a semiconductor device of an embodiment of the present invention is implemented. In accordance with this embodiment, the embedded semiconductor device 5000 includes a flash-memory (flash EEPROM) 90, an SRAM memory 92, a RISC 94, an analog circuit 96 and an interface circuit 98 that are mixed and mounted in an SOG (sea of gates) structure.

Figure 15:
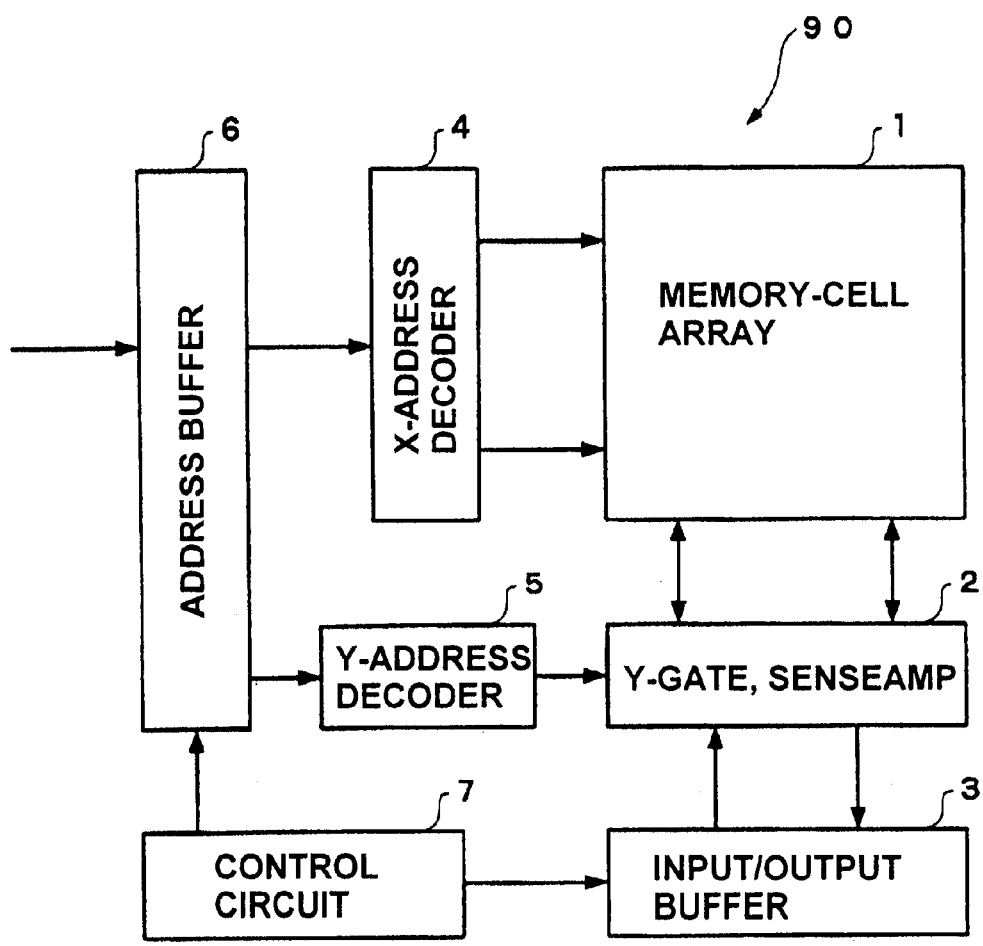
FIG. 15 shows a block diagram of a flash memory of the embedded semiconductor device shown in FIG. 14.

FIG. 15 shows a block diagram of a common structure of a flash-memory. The flash-memory includes a memory cell array 1 in which memory transistors are disposed in an array, a Y-gate and sense amplifier 2, an input/output buffer 3, an X-address decoder 4, a Y-address decoder 5, an address buffer 6 and a control circuit 7.

The memory cell array 1 corresponds to the memory region 4000 shown in FIG. 1 and has a plurality of split-type memory transistors 400 disposed in a matrix. The memory cell array 1 connects to the X-address decoder 4 and the Y-gate 2 in order to select rows and columns of the memory cell array 1. The Y-gate 2 connects to the Y-address decoder 5 that provides column selection data. The X-address decoder 4 and the Y-address decoder 5 connect to the address buffer 6 that temporarily stores address data.

The Y-gate 2 connects to a write-voltage generation circuit (not shown) for conducting a data-wiring operation, and to a sense amplifier for conducting a data-reading operation. The X-address decoder connects to an erasing-voltage generation circuit for conducting a data-erasing operation. The write-voltage generation circuit and the sense amplifier 2 connects to the input/output buffer 3 that temporarily stores input and output data. The address buffer 6 and the input/output buffer 3 connect to the control circuit 7 that controls the operation of the flash-memories. The control circuit 7 performs the control operation base on chip enable signal, output enable signals and program signals.

In the embedded semiconductor device 5000, transistors operable at different voltage levels are selected depending on the operation voltages of the respective circuits.

The first voltage-type transistor 100 that is operated at a first voltage level is included in, for example, at least one of the Y-gate sense amplifier, the input/output buffer, the X-address decoder, the Y-address decoder, the address buffer, the control circuit, the SOG and the gate array.

The second voltage-type transistor 200 that is operated at a second voltage is included in, for example, at least one of the Y-gate sense amplifier, the input/output buffer, the X-address decoder, the Y-address decoder and the interface circuit.

The third voltage-type transistor 300 that is operated at a third voltage is included in, for example, at least one of the writing-voltage generation circuit, the erasing-voltage generation circuit and the step-up circuit.

FIG. 14 shows an example of a layout of the embedded semiconductor device 5000. The present invention is applicable to various types of system LSIs.

Next, a method for manufacturing a semiconductor device such as that shown in FIG. 1 in accordance with one embodiment of the present invention will be described with reference to FIGS. 2 through 13.

Figure 2:
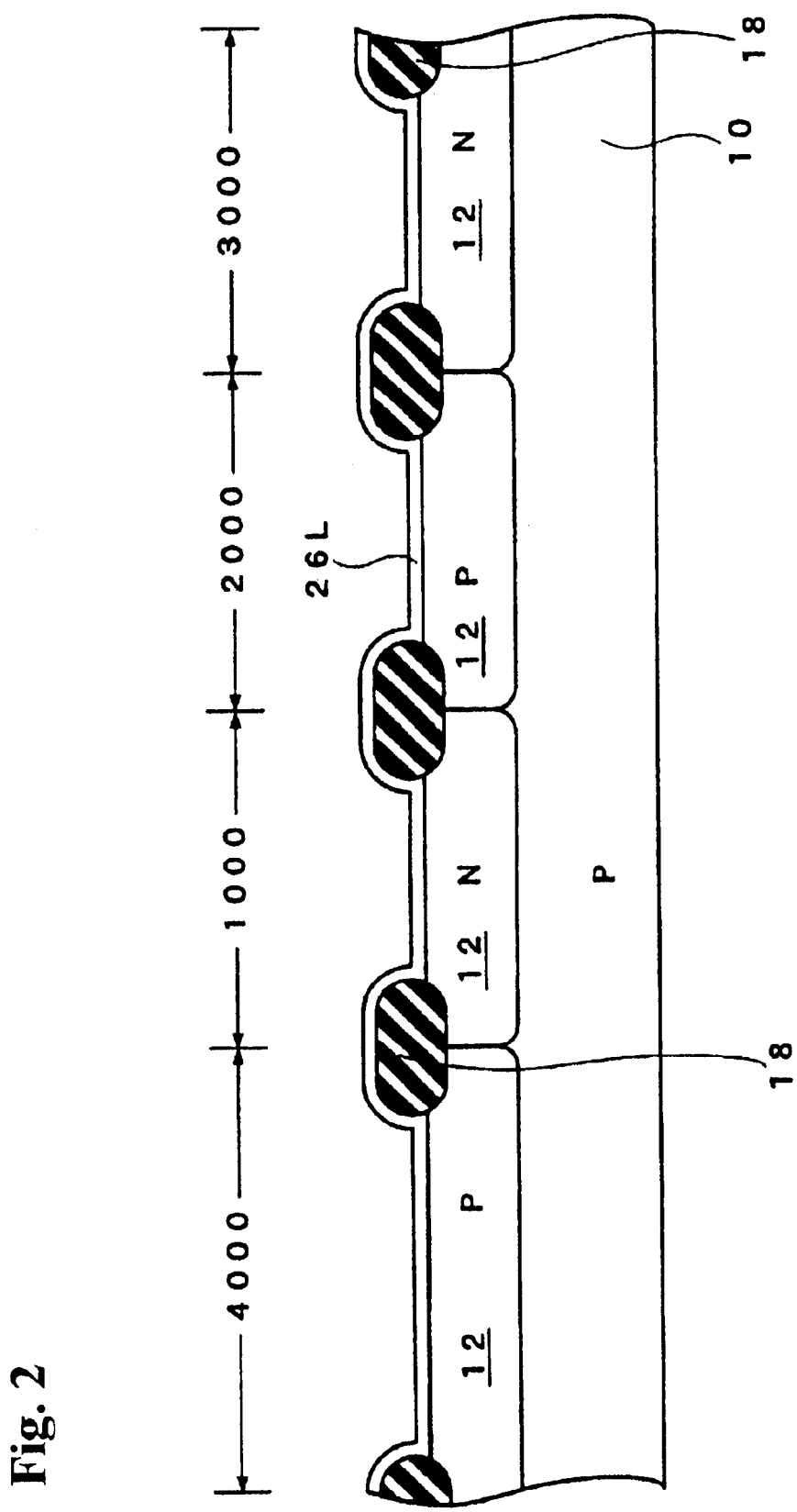
FIGS. 2–13 illustrate cross-sectional views of a wafer during manufacturing for forming the semiconductor device shown in FIG. 1, according to embodiments of the present invention.

(A) First, as shown in FIG. 2, a field insulation layer 18 is formed on the surface of a silicon substrate 10 in a predetermined region thereof by a selective oxidation method. Then, a P-type impurity (for example, boron) or an N-type impurity (arsenic or phosphorous) is doped in the P-type silicon substrate 10 to thereby form a P-type well or an N-type well 12 in a predetermined region of the substrate 10.

Further, a silicon oxide layer 26L is formed on the surface of the silicon substrate 10 by, for example, a thermal oxidation method. The silicon oxide layer 26L becomes a gate insulation layer 26 of the memory transistor 400. The silicon oxide layer 26L may preferably have a thickness of 6–9 nm, in consideration of the gate dielectric strength.

Figure 3:
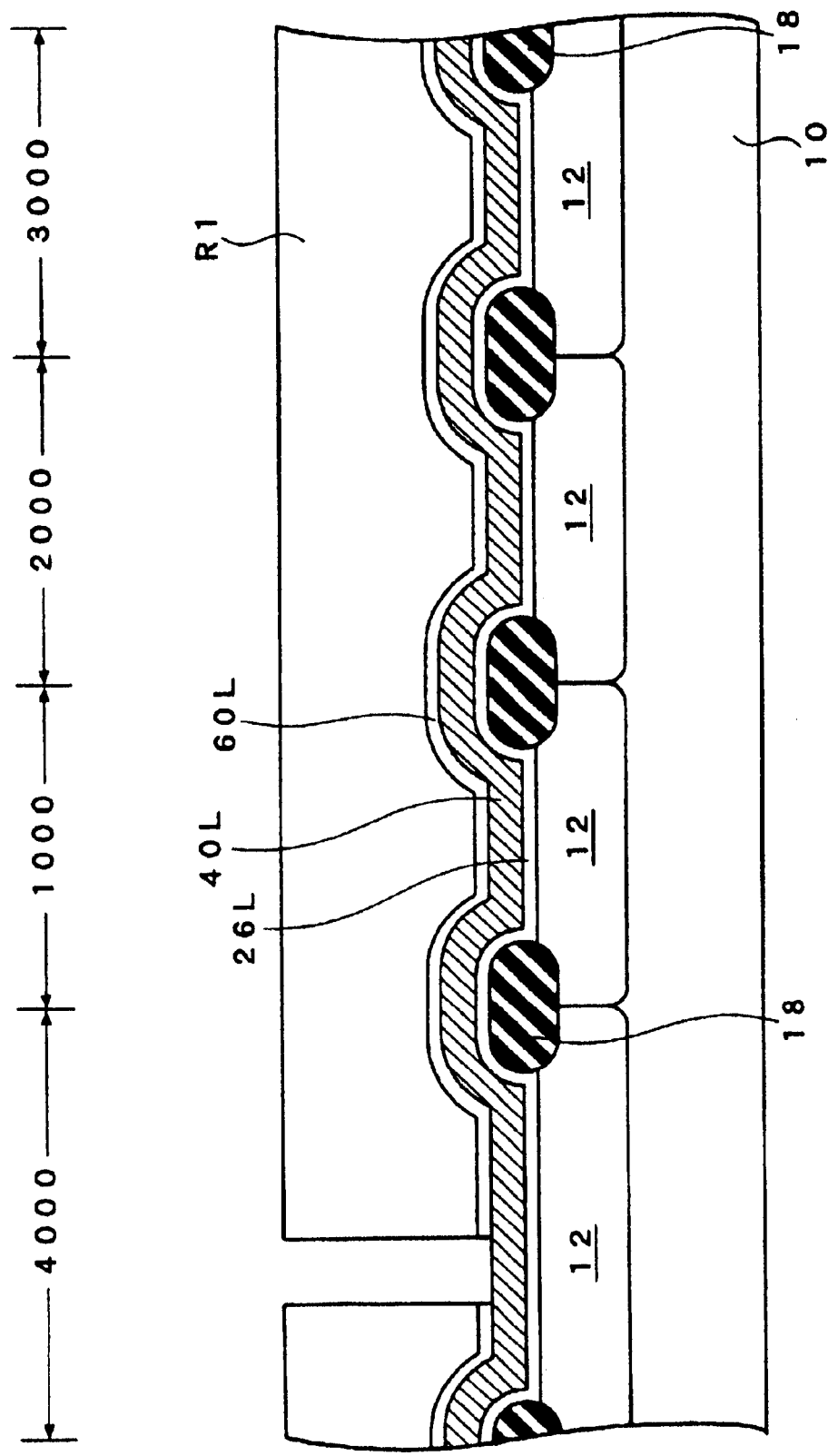

(B) Then, as shown in FIG. 3, a polysilicon layer 40L is formed on the surface of the silicon oxide layer 26L by, for example, a CVD method. The polysilicon layer 40L becomes a floating gate 40 of the memory transistor 400. The polysilicon layer 40L may preferably have a thickness of 100–200 nm.

Then, a first silicon nitride layer 60L is formed on the surface of the polysilicon layer 40L. The first silicon nitride layer 60L may preferably have a thickness of 50–150 nm. Then, the silicon nitride layer 60L is selectively etched, using a resist layer R1 as a mask, to remove a predetermined region thereof. The region of the first silicon nitride layer 60L that is removed corresponds to a region where a selective oxide insulation layer 42 of the memory transistor 400 is formed.

Then, phosphorous or arsenic is diffused in the polysilicon layer 40L, using the resist layer R1 formed on the first silicon nitride layer 60L as a mask, to form an N-type polysilicon layer 40L. The polysilicon layer may be changed to N-type by other methods. For example, after the polysilicon layer is formed, the polysilicon layer is implanted with phosphorous ions or arsenic ions. Alternatively, after the polysilicon layer is formed, the polysilicon layer is contacted with a carrier gas containing phosphoryl chloride ($POCl_3$). Alternatively, when the polysilicon layer is formed, the layer is contacted with a carrier gas containing phosphine ($PH_3$).

Then, the resist layer R1 is removed.

Figure 4:
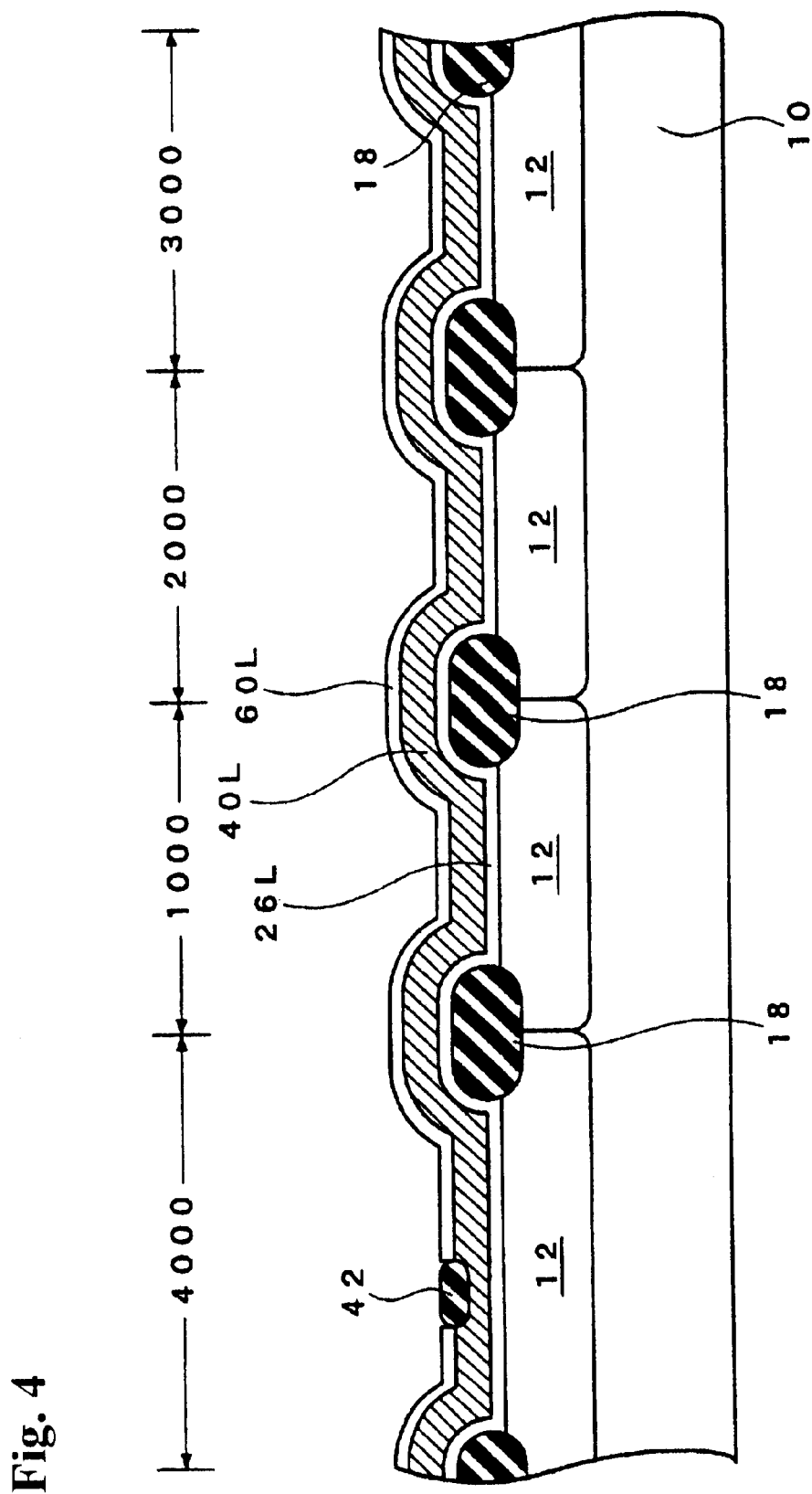

(C) Next, as shown in FIG. 4, an exposed portion in the polysilicon layer 40L is selectively oxidized to form a selective oxide insulation layer 42 on the surface of the polysilicon layer 40L in a predetermined region thereof. The selective oxide insulation layer 42 formed by the selective oxidation preferably has a maximum film thickness at its central area, and gradually becomes thinner toward end sections thereof. The selective oxide insulation layer 42 may preferably have a film thickness of 100–200 nm at the thickest portion. Thereafter, the first silicon nitride layer 60L is removed.

Figure 5:
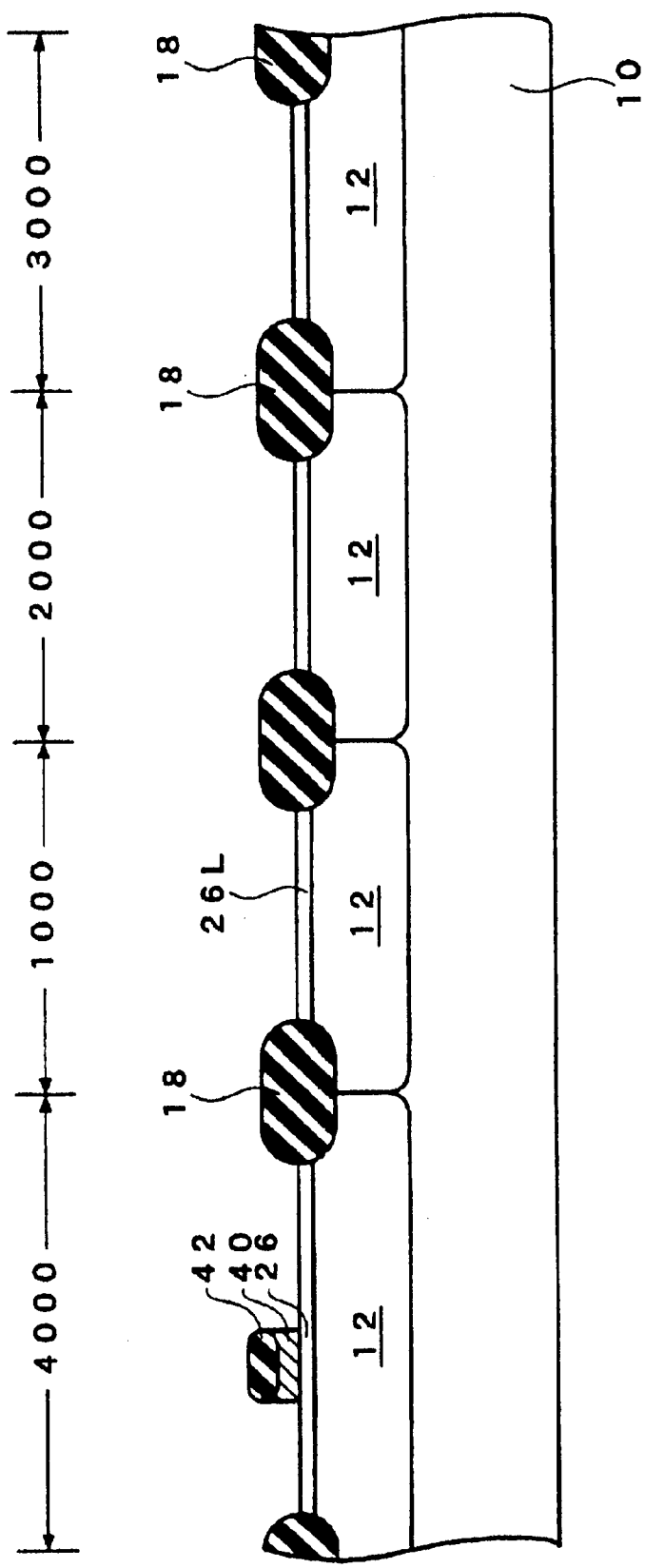

(D) Next, as shown in FIG. 5, an etching is conducted, using the selective oxide insulation layer 42, to selectively remove the polysilicon layer 40L.

By the steps described above, the gate insulation layer 26, the floating gate 40 and the selective oxide insulation layer 42 are formed in the memory region 4000.

Figure 6:
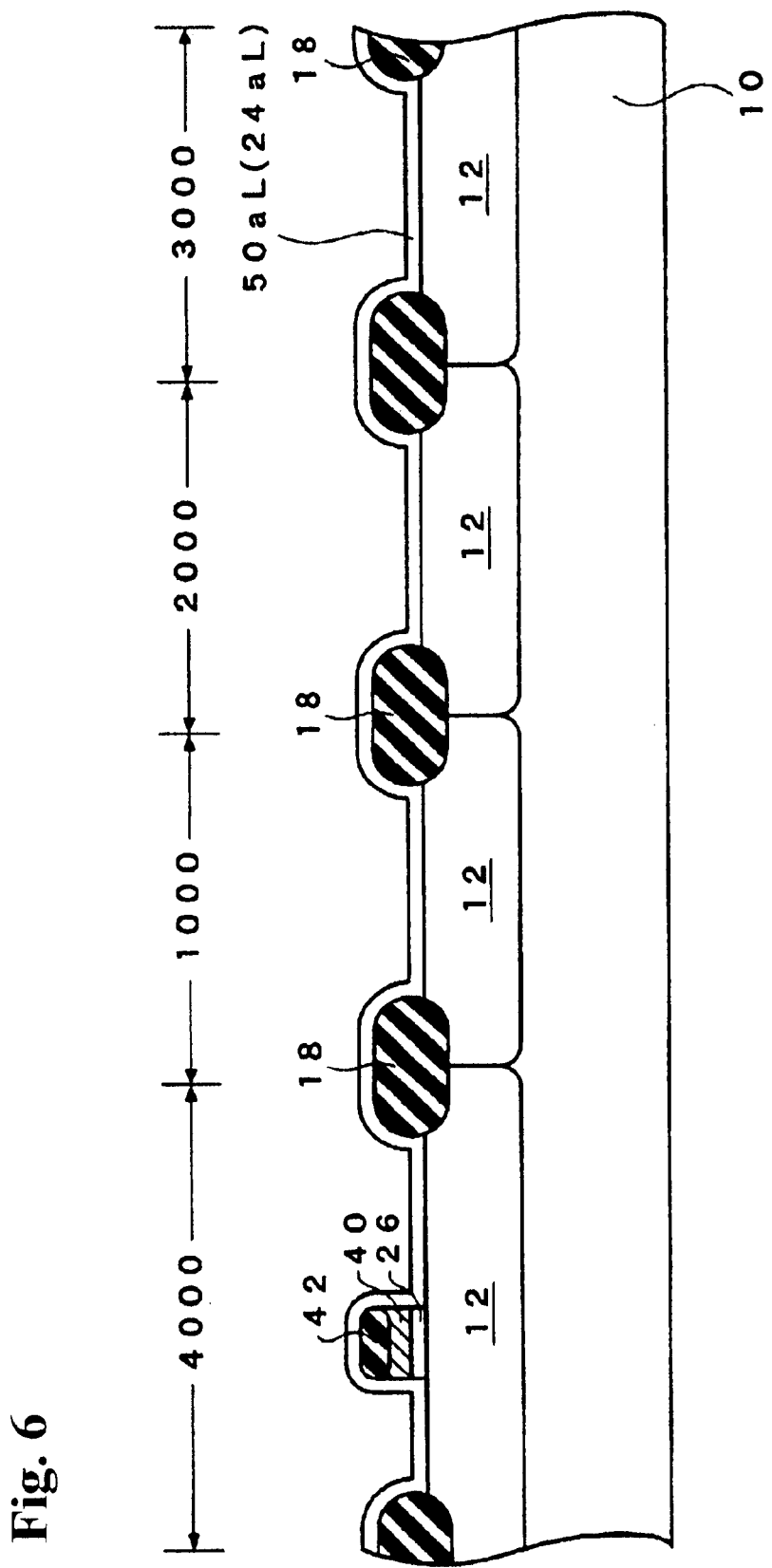

(E) Then, as shown in FIG. 6, the silicon oxide layer 26L is removed by a wet-etching, and then a first silicon oxide layer 50aL (24aL) is formed on the surface of the wafer by a thermal oxidation method. The silicon oxide layer 50aL (24aL) becomes a first insulation layer 50a that forms an intermediate insulation layer 50 of the memory transistor 400, and a first insulation layer 24a that forms a gate insulation layer 24 of the third voltage-type transistor 300. The silicon oxide layer 50aL may preferably have a thickness of 5–15 nm, for example.

The silicon oxide layer may preferably be formed by any one of the following thermal oxidation methods:

(a) a dry-oxidation is conducted at 700–1000° C.;

(b) after the dry-oxidation conducted in the above (a), a wet-oxidation is further conducted at 700–1000° C.; and (c) after the step (a) or the step (b), an anneal treatment is conducted in a nitrogen atmosphere at 700–1000° C. for 10–30 minutes.

By conducting the dry-oxidation in step (a) described above, the size of polysilicon grains on the surface of the floating gate 40 becomes uniform, and the planarization of the surface of the floating gate 40 is improved. As a result, the interface state of the floating gate 40 becomes more stabilized, the electron capturing is reduced, and the cycle life of write/erase operations of the memory transistor is extended.

Further, when at least one of the wet-oxidation in step (b) and the anneal treatment in step (c) is added after the dry-oxidation in step (a), the silicon oxide layer 50aL is further densified, and the electron capturing is reduced, such that the film characteristics can be improved.

Figure 7:
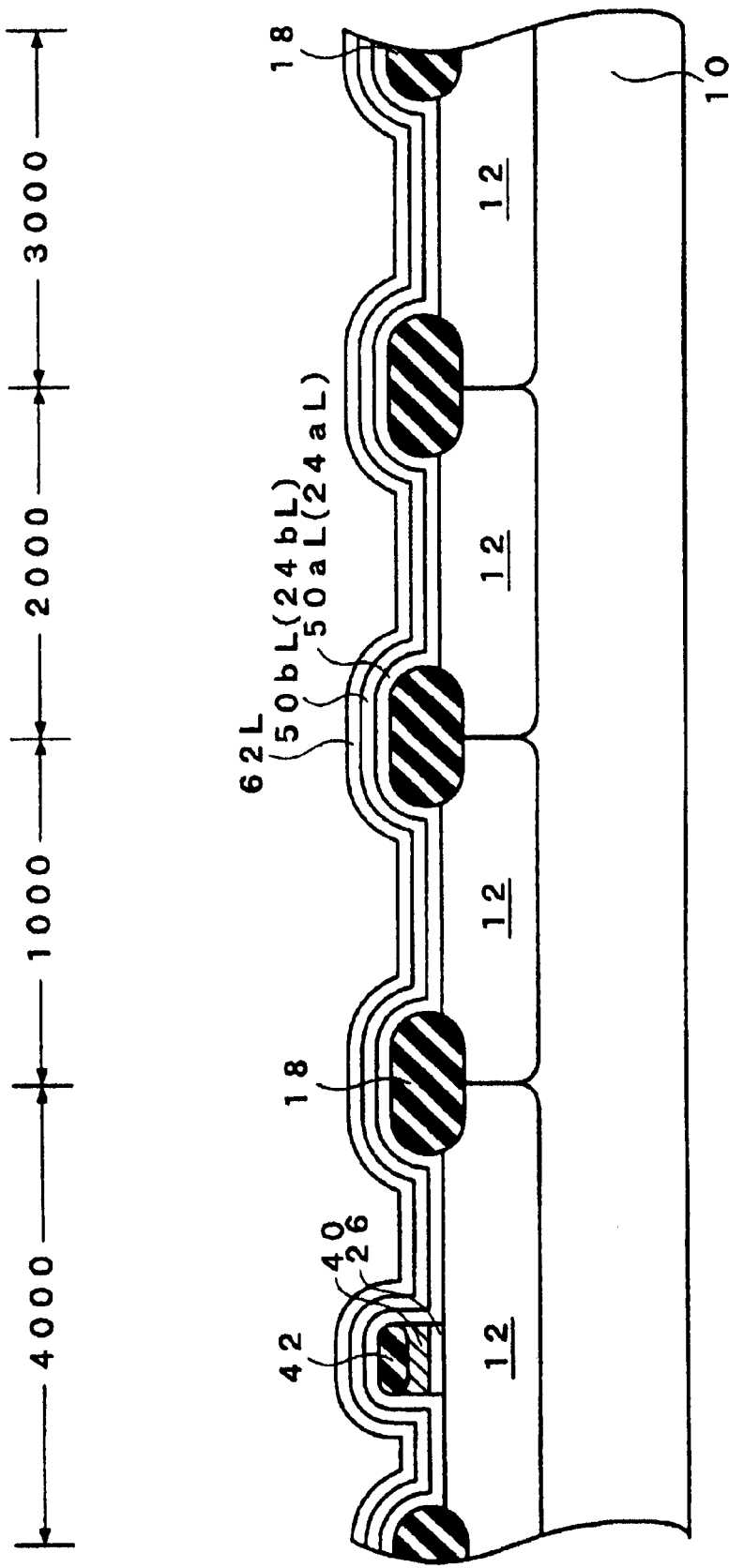

(F) Then, as shown in FIG. 7, a second silicon oxide layer 50bL (24bL) is further formed on the surface of the first silicon oxide layer 50aL (24aL). The second silicon oxide layer 50bL (24bL) is formed by a CVD method. The second silicon oxide layer 50bL (24bL) becomes a second insulation layer 50b that forms an intermediate insulation layer 50 of the memory transistor 400, and a second insulation layer 24b that forms a gate insulation layer 24 of the third voltage-type transistor 300. The silicon insulation layer 50bL (24bL) has a thickness of 10–20 nm, for example.

Considering the density of the formed film, the permeability resistance against oxygen ions and the like, the CVD method used in this embodiment may preferably be conducted by the HTO (high temperature oxide) method, a TEOS (tetraethyl orthosilicate) method using ozone as an oxidation agent or a plasma TEOS method. A preferred temperature range for an HTO method is about 700–900° C.

Next, a second silicon nitride layer 62L is formed on the surface of the silicon oxide layer 50bL (24bL). The second silicon nitride 62L may preferably have a film thickness of 10–20 nm. Due to the second silicon nitride layer 62L thus formed, although the second silicon nitride layer 62L will be removed in step (I) that is later performed, the intermediate insulation layer 50 of the memory transistor 400 and the gate insulation layer 24 of the third voltage-type transistor 300 do not unnecessary become thick, and thus the film thickness can be precisely controlled. Then, an anneal treatment may be conducted at 700–1000° C. for about 20–40 minutes to densify the insulation layers.

Figure 8:
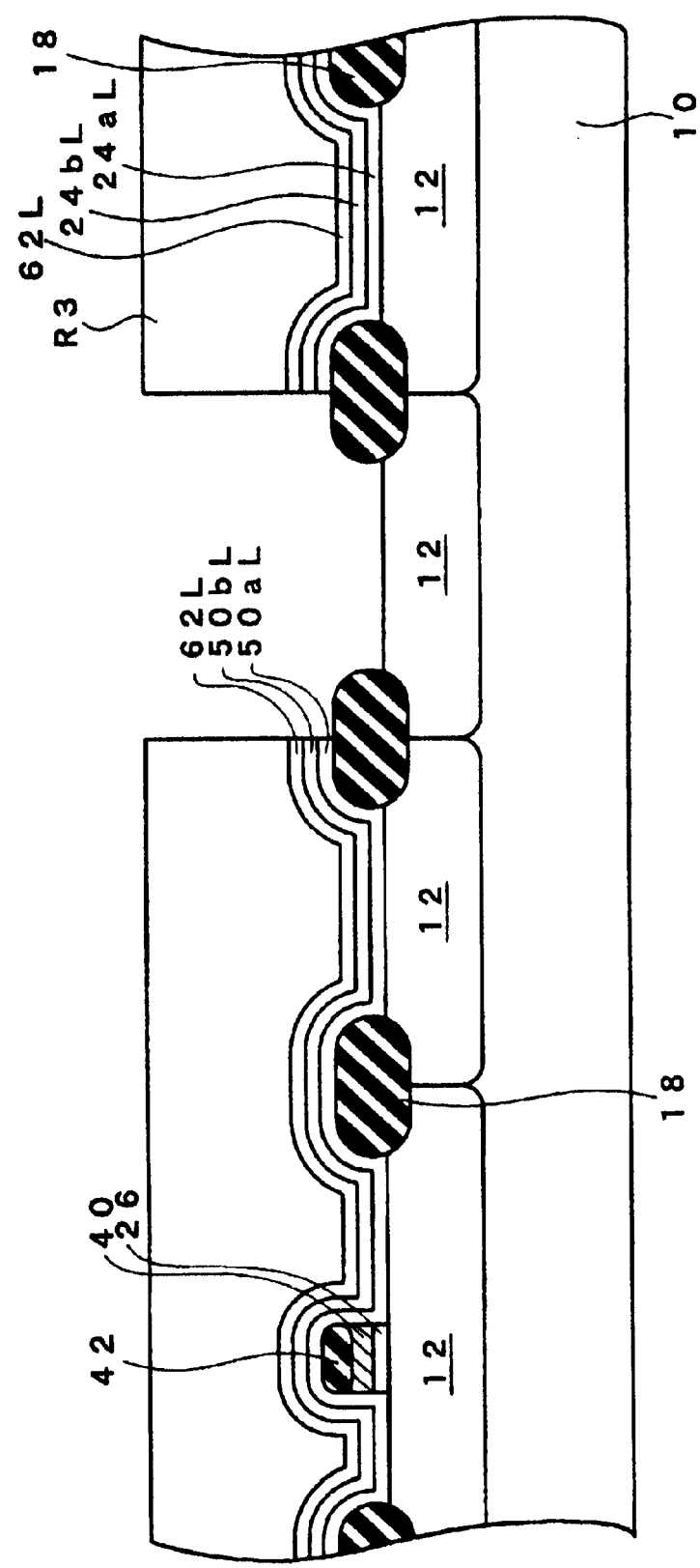

(G) Then, as shown in FIG. 8, a resist layer R3 defining an opening section in the second transistor region 2000 is formed. The second silicon nitride layer 62L, the upper silicon oxide layer 50bL and the lower silicon oxide layer 50aL in the transistor region 2000 may be removed by a dry-etching and a wet-etching, using the resist layer R3 as a mask. Then, the resist layer R3 is removed.

Figure 9:
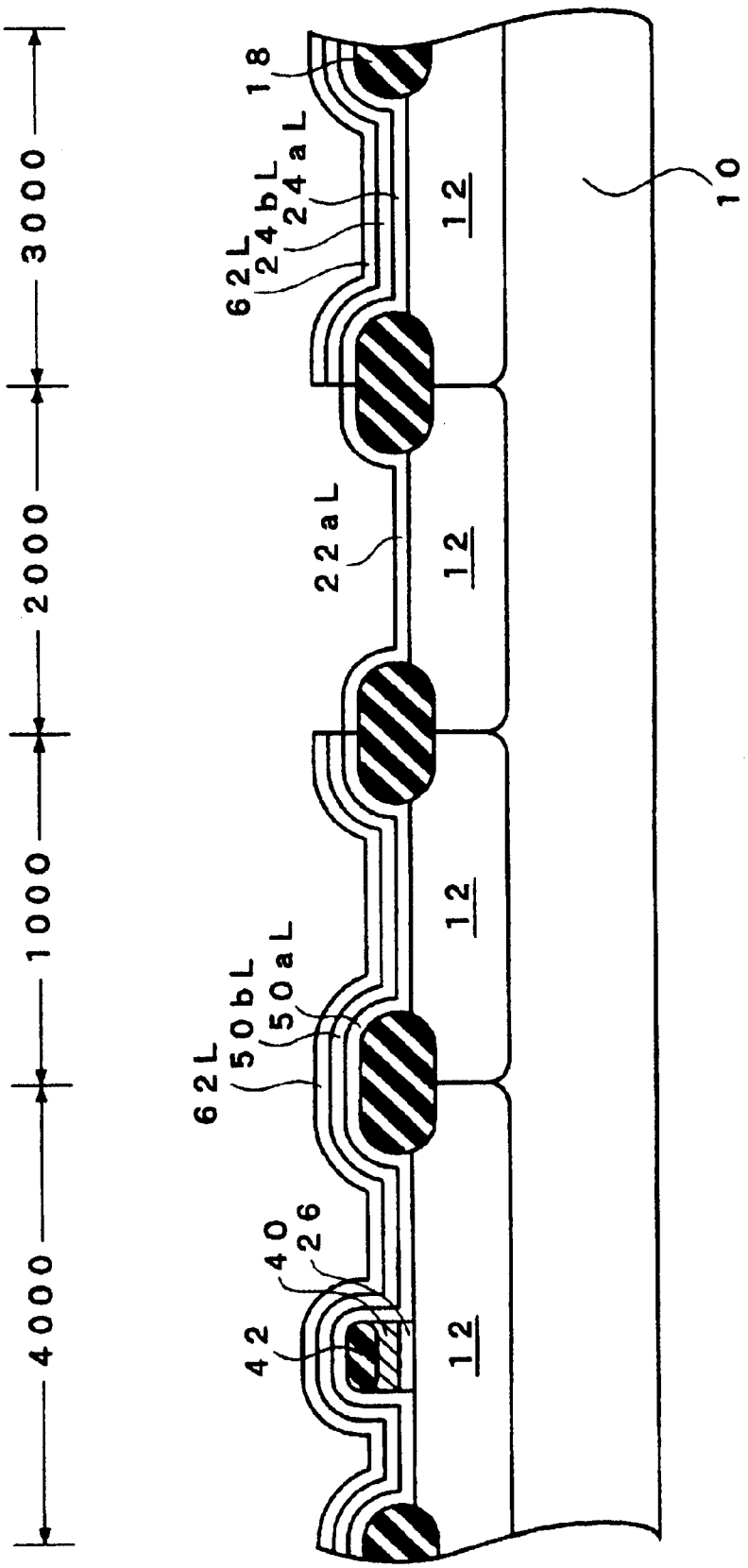

(H) Then, as shown in FIG. 9, the surface of the wafer is subjected to a thermal oxidation, for example, a wet-oxidation at 700–900° C., to thereby form a third silicon oxide layer 22aL. The silicon oxide layer 22aL becomes a first insulation layer 22a that forms the gate insulation layer 22 of the second voltage-type transistor 200. The silicon oxide layer 22aL has a film thickness of 3–15 nm, for example.

Figure 10:
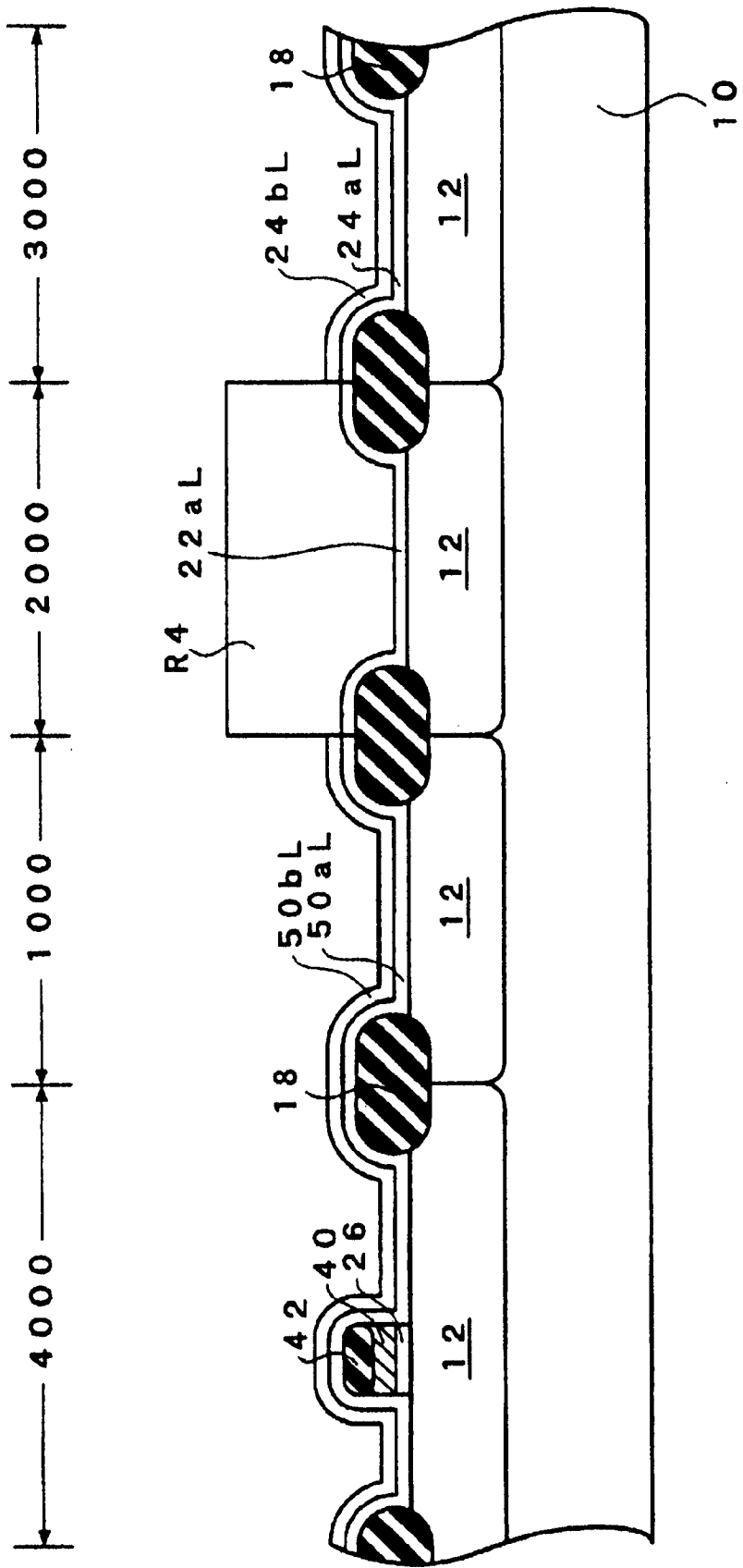

(I) Then, as shown in FIG. 10, a resist layer R4 is formed on the surface of the silicon oxide layer 22aL in the second transistor region 2000. The second silicon nitride layer 62L is removed by a dry-etching, using the resist layer R4 as a mask. Thereafter, the resist layer R4 is removed.

Figure 11:
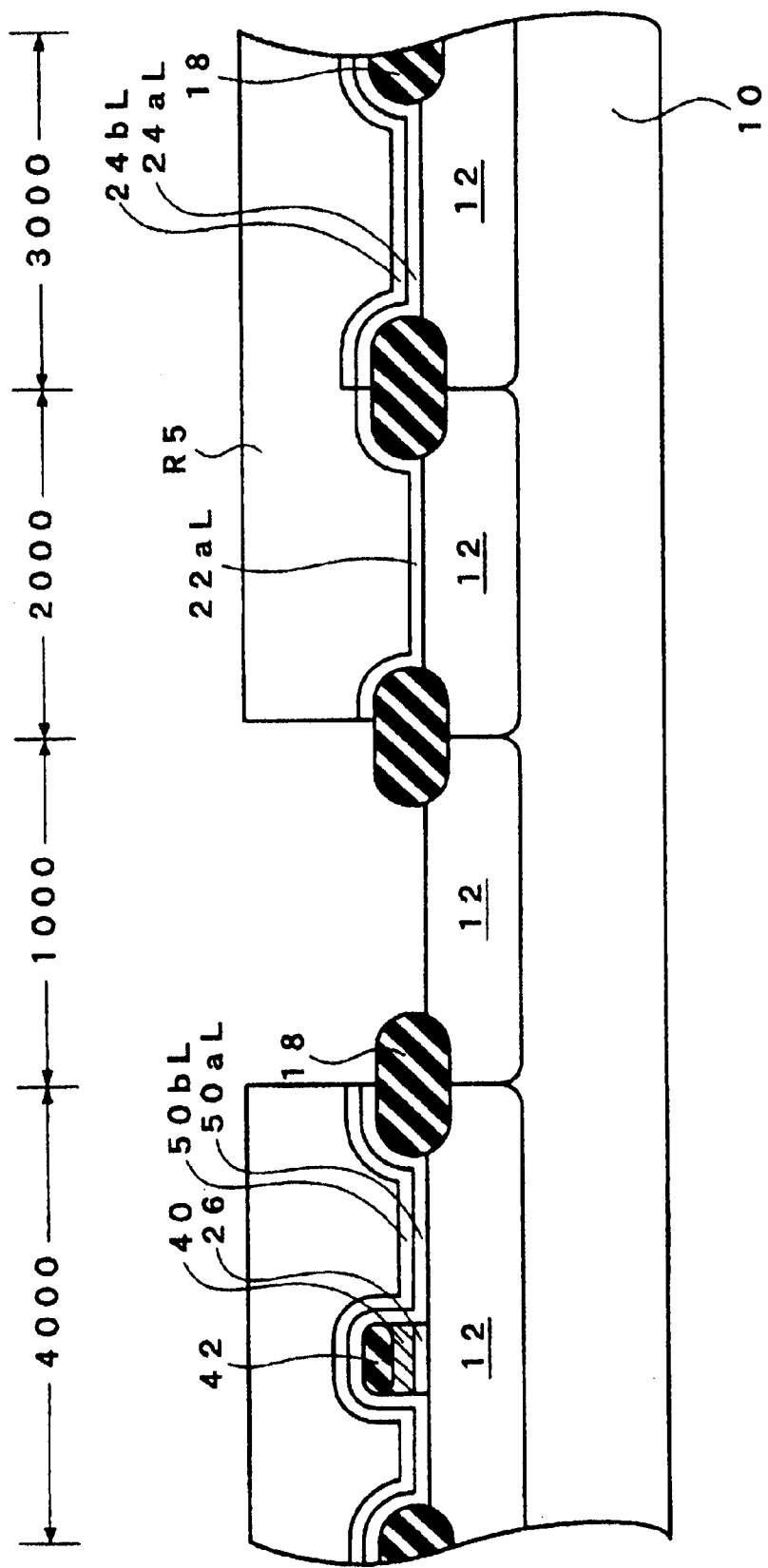

(J) Then, as shown in FIG. 11, a resist layer R5 defining an opening in the first transistor region 1000 is formed. The two layers of the silicon oxide layers 50bL and 50aL in the first transistor region 1000 are removed by a wet-etching, using the resist layer R5 as a mask. Then, the resist layer R5 is removed.

Figure 12:
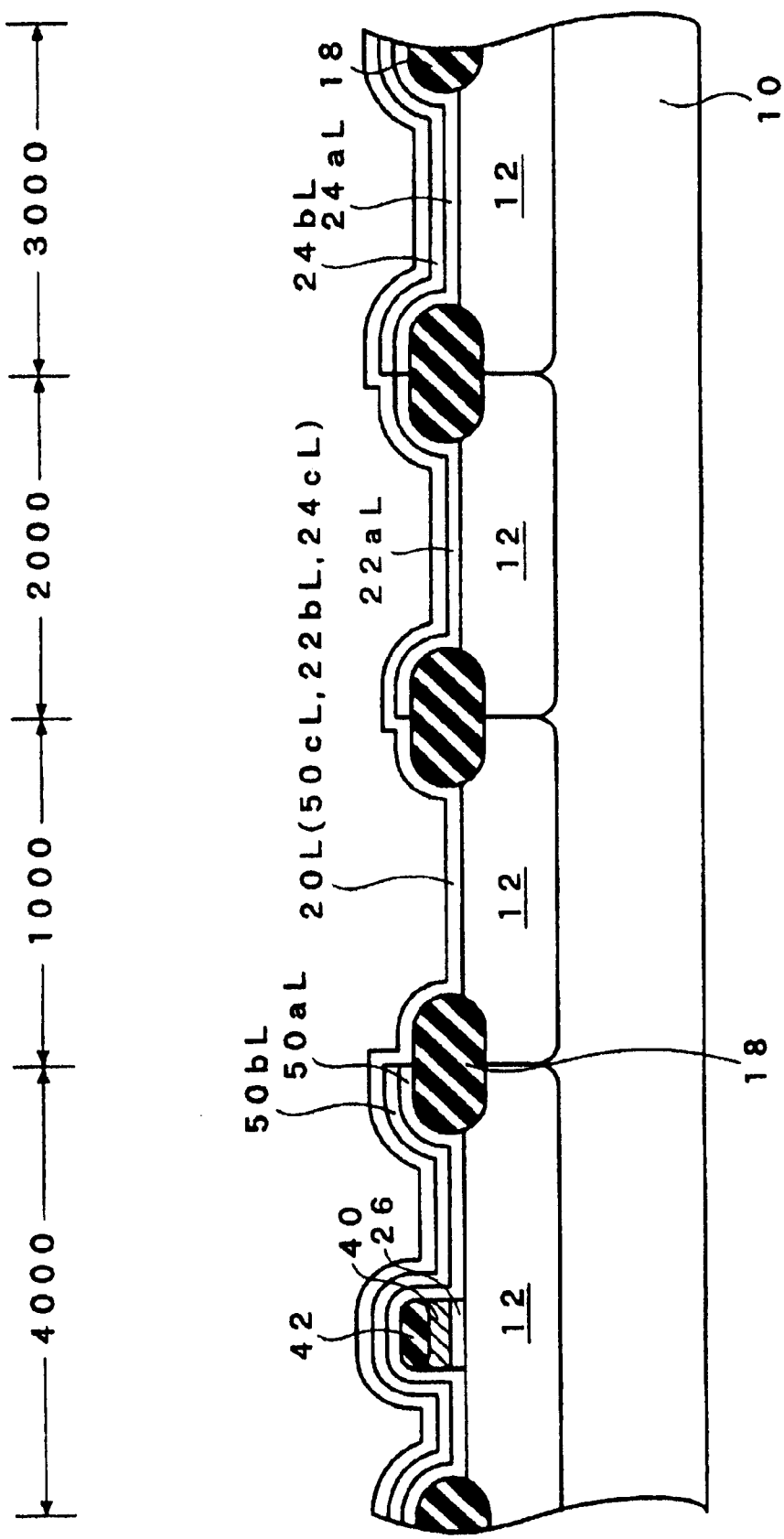

(K) Then, as shown in FIG. 12, the surface of the wafer is subjected to a thermal oxidation, for example, a wet-oxidation conducted at 700–900° C., to form a fourth silicon oxide layer 20L (50cL, 22bL, 24cL) on the surface of the wafer. The silicon oxide layer 20L becomes the gate insulation layer 20 of the first voltage-type transistor 100, the second insulation layer 22b that forms the gate insulation layer 22 of the second voltage-type transistor 200, the first insulation layer 24c that forms the gate insulation layer 24 of the third voltage-type transistor 300, and the third insulation layer 50c that forms the intermediate insulation layer 50 of the memory transistor 400. The silicon oxide layer 20L has a film thickness of 1–10 nm, for example.

The steps described above form the insulation layers that compose the intermediate insulation layer 50 of the memory transistor 400, the gate insulation layer 20 of the first voltage-type transistor 100, the gate insulation layer 22 of the second voltage-type transistor 200 and the gate insulation layer 24 of the third voltage-type transistor 300.

Figure 13:
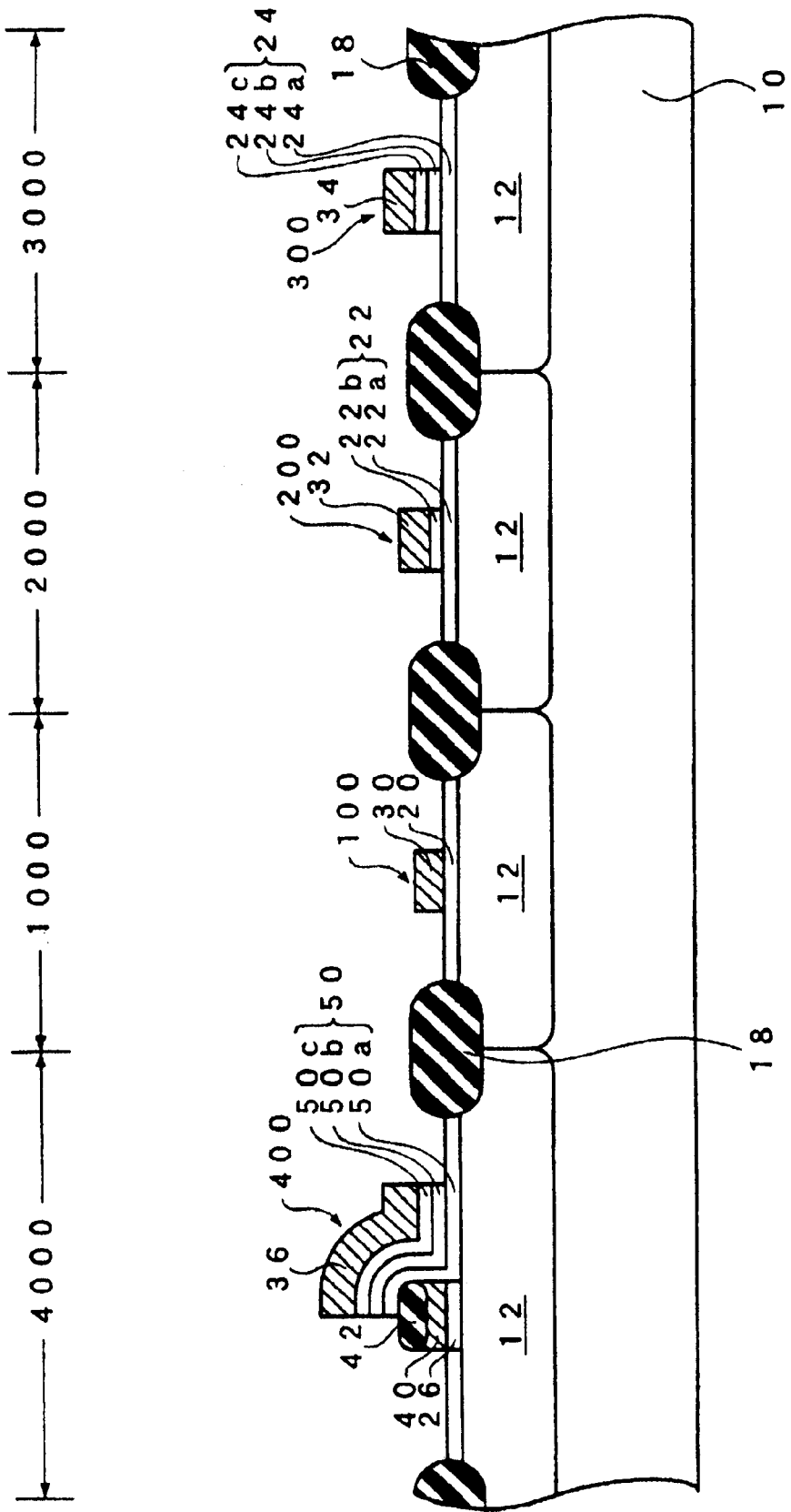

(L) Then, as shown in FIG. 13, a polysilicon layer is formed on the surface of the wafer in the same manner as conducted in step (C) described above. Alternatively, a polycide layer may be formed by a know method, instead of a polysilicon layer. A resist layer having a predetermined pattern is formed on the polysilicon layer, and then a patterning is conducted by an etching to form a gate insulation layer and a gate electrode of each of the memory transistor 400, the first voltage-type transistor 100, the second voltage-type transistor 200 and the third voltage-type transistor 300. In this embodiment, the etching is conducted in a manner that the silicon oxide layer remains to a preferred film thickness of 1–5 nm on exposed surfaces of the silicon substrate 10.

(M) Then, as shown in FIG. 1, an N-type impurity for an N-channel type transistor and a P-type impurity for a P-channel type transistor are doped in predetermined ones of the wells 12 by a know method. As a result, impurity diffusion regions that compose the sources 16 and the drains 14 are formed.

Then, an interlayer dielectric layer 600 that is composed of a silicon oxide layer is formed by, for example, a CVD method on the surface of the wafer on which the transistors 100, 200 and 300 and the memory transistor 400 are formed. Then, the interlayer dielectric layer 600 is selectively etched to remove predetermined regions thereof to define contact holes that reach the sources 16 and the drains 14. Then, a conductive layer composed of an aluminum layer or the like is deposited on the interlayer dielectric layer 600 and in the contact holes by, for example, a sputtering method. The conductive layer is patterned to form metal wiring layers (for example, bit lines and source lines) 80 that electrically connect to the impurity diffusion regions.

In the manufacturing method described above, the memory transistor 400, the first voltage-type transistor 100, the second voltage-type transistor 200 and the third voltage-type transistor 300 are formed in the memory region 4000, the first transistor region 1000, the second transistor region 2000 and the third transistor region 3000. According to this embodiment, a semiconductor device having a memory transistor with a split-gate structure and transistors that operate at at least three different voltage levels mixed and mounted therein can be manufactured with fewer manufacturing steps.

In the manufacturing method embodiment described above, the second insulation layer 22b that forms the gate insulation layer 22 of the second voltage-type transistor 200 is formed in the same step in which the gate insulation layer 20 of the first voltage-type transistor 100 is formed. Similarly, the third insulation layer 24c that forms the gate insulation layer 24 of the third voltage-type transistor 300 and the third insulation layer 50c that forms the intermediate insulation layer 50 of the memory transistor 400 are formed in the same step in which the gate insulation layer 20 of the first voltage-type transistor 100 is formed. Also, the first through the third insulation layers 24a, 24b and 24c that form the gate insulation layer 24 of the third voltage-type transistor 300 are formed in the same steps in which the first through the third insulation layers 50a, 50b and 50c that form the intermediate insulation layer 50 of the memory transistor 400 are formed, respectively. In this manner, the gate insulation layer and the intermediate insulation layer are formed by common steps. As a result, gate insulation layers having different dielectric strengths, in other words, different film thickness, can be formed by fewer steps.

In steps (E) and (F) in the manufacturing method embodiment described above, the silicon oxide layers 50aL and 50bL that form the first and the second insulation layers 50a and 50b of the intermediate insulation layer (tunnel insulation layer) 50 are formed, and then the second silicon nitride layer 62 is formed. As a result, the silicon oxide layers 50aL and 50bL are covered and protected by the silicon nitride layer 62L in a thermal oxidation that is later conducted or in cleaning steps before or after the thermal oxidation. Any adverse effects of the thermal oxidation step and the cleaning steps on the silicon oxide layers can be inhibited. As a result, a tunnel insulation layer having an excellent characteristic can be obtained, and highly reliable memory characteristics can be realized.

Further, while the second silicon nitride layer 62L is formed on the silicon oxide layers 50aL and 50bL, a thermal treatment (including a thermal treatment in an oxidation process) is preferably conducted. As a result, the silicon oxide layers are densified and the film quality of the silicon oxide layers is improved. Thus, the memory characteristics can be improved. In particular, the number of data writing/erasing operations (cycle life) can be extended.

What is claimed:

1. A method for manufacturing a semiconductor device comprising a memory region, first, second and third transistor regions including field effect transistors that operate at different voltage level, wherein the memory region includes a split-gate non-volatile memory transistor, the first transistor region includes a first voltage-type transistor that operates at a first voltage level, the second transistor region includes a second voltage-type transistor that operates at a second voltage level, and the third transistor region includes a third voltage-type transistor that operates at a third voltage level, the method for manufacturing the semiconductor device comprising the steps of:

(a) forming a gate insulation layer and a floating gate that compose a portion of the non-volatile memory transistor on a silicon substrate in the memory region;

(b) forming a first silicon oxide layer on the silicon substrate by a thermal oxidation method, and a second silicon oxide layer by a CVD method;

(c) forming a mask layer defining an opening in the first transistor region, and removing the first and the second silicon oxide layers in the first transistor region;

(d) forming a silicon oxide layer on the wafer by a thermal oxidation method for gate insulation layers of at least the first voltage-type transistor and the second voltage-type transistor;

(e) forming a conductive layer and thereafter conducting a patterning to form an intermediate insulation layer and a control gate of the non-volatile memory transistor and a gate insulation layer and a gate electrode for each of the transistors in the transistor regions; and (f) forming an impurity diffusion region that forms a source or a drain by doping an N-type impurity or a P-type impurity in a predetermined region of the silicon substrate, wherein the silicon oxide layer formed in the step (d) forms at least part of a gate insulation layer of the first voltage-type transistor and a gate insulation layer of the second voltage-type transistor.

2. A method for manufacturing a semiconductor device having a non-volatile memory transistor according to claim 1, further comprising the steps of:

(g) forming a mask layer defining an opening in the second transistor region, and removing the first and the second silicon oxide layers in the second transistor region; and (h) forming a silicon oxide layer on the wafer by a thermal oxidation method for a gate insulation layer of the second voltage-type transistor.

3. A method for manufacturing a semiconductor device having a non-volatile memory transistor according to claim 2, further comprising forming the gate insulation layer of the second voltage-type transistor from two layers, wherein one of the layers comprises a silicon oxide layer that is formed in the step (d), and the other layer comprises a silicon oxide layer that is formed. in the step (h).

4. A method for manufacturing a semiconductor device having a non-volatile memory transistor according to claim 3, further comprising forming the gate insulation layer of the third voltage-type transistor from at least three layers, wherein the insulation layers include three silicon oxide layers that are formed in the step (b) and (d).

5. A method for manufacturing a semiconductor device having a non-volatile memory transistor according to claim 4, where in the split-gate type non-volatile memory transistor includes a source, a drain, a gate insulation layer, a floating gate, an intermediate insulation layer that functions as a tunnel insulation layer and a control gate, further comprising forming the intermediate insulation layer from at least three layers, wherein one of the three layers is composed of a silicon oxide layer that is formed in the step (d).

6. A method for manufacturing a semiconductor device having a non-volatile memory transistor according to claim 5, further comprising forming the intermediate insulation layer to include first and second outermost layers that respectively contact the floating gate and the control gate, and wherein the outermost layers comprise silicon oxide layers that are formed by a thermal oxidation method.

7. A method for manufacturing a semiconductor device having a non-volatile memory transistor according to claim 6, further comprising forming the first outermost layer to include the first silicon oxide layer that is formed in the step (b) and forming the second outermost layer to include the silicon oxide layer that is formed in the step (d).

8. A method for manufacturing a semiconductor device having a non-volatile memory transistor according to claim 7, further comprising forming the intermediate insulation layer to include the second silicon oxide layer that is formed in the step (b) between the first and the second outermost layers.

9. A method for manufacturing a semiconductor device having a non-volatile memory transistor according to claim 8, further comprising forming the third voltage-type transistor including a gate insulation layer having the same structure as that of the intermediate insulation layer of the non-volatile memory transistor and comprising the three silicon oxide layers that are formed in the steps (b) and (d).

10. A method for manufacturing a semiconductor device having a non-volatile memory transistor according to claim 9, after the step (b), further comprising the step (i) of forming an insulation layer other than a silicon oxide layer on the second silicon oxide layer.

11. A method for manufacturing a semiconductor device having a non-volatile memory transistor according to claim 9, wherein the insulation layer other than a silicon oxide layer comprises silicon nitride.

12. A method for manufacturing a semiconductor device having a non-volatile memory transistor according to claim 10, further comprising conducting a heat treatment is after the step (i).

13. A method for manufacturing a semiconductor device having a non-volatile memory transistor according to claim 1, further comprising:

forming the first silicon oxide layer in the step (b) to a film thickness of 5–15 nm;

forming the second silicon oxide layer in the step (b) to a film thickness of 10–20 nm; and forming the silicon oxide layer that in the step (d) to a film thickness of 1–10 nm.

14. A method for manufacturing a semiconductor device having a non-volatile memory transistor according to claim 13, further comprising forming the first voltage-type transistor to include a gate insulation layer having a thickness of 3–13 nm.

15. A method for manufacturing a semiconductor device having a non-volatile memory transistor according to claim 14, further comprising forming the second voltage-type transistor to include a gate insulation layer having a film thickness of 4–15 nm.

16. A method for manufacturing a semiconductor device having a non-volatile memory transistor according to claim 15, further comprising forming the third voltage-type transistor to include a gate insulation layer having a thickness of 16–45 nm.

17. A method for manufacturing a semiconductor device having a non-volatile memory transistor according to claim 16, further comprising forming the non-volatile memory transistor to include an intermediate insulation layer having a thickness of 16–45 nm.

18. A method for manufacturing a semiconductor device having a non-volatile memory transistor according to claim 6, further comprising forming the first outermost layer that forms the intermediate insulation layer of the non-volatile memory transistor to include a film thickness of 5–15 nm and the second outermost layer to include a thickness of 1–10 nm.

19. A method for manufacturing a semiconductor device having a non-volatile memory transistor according to claim 1, wherein the first voltage level that operates the first voltage-type transistor is at a value of 1.8–3.3 V, the second voltage level that operates the second voltage-type transistor is at a value of 2.5–5 V, and the third voltage level that operates the third voltage-type transistor is at a value of 10–15 V.

20. A method for manufacturing a semiconductor device having a non-volatile memory transistor according to claim 1, further comprising at least the step of forming a flash-memory.

21. A method for manufacturing a semiconductor device having a non-volatile memory transistor according to claim 20, further comprising the step of forming another circuit region mounted together with the flash memory.

22. A method for manufacturing a semiconductor device having a non-volatile memory transistor according to claim 20, further comprising forming the first voltage-type transistor in at least one circuit selected from a group consisting of a Y-gate, a sense amplifier, an input/output buffer, an X-address decoder, a Y-address decoder, an address buffer and a control circuit.

23. A method for manufacturing a semiconductor device having a non-volatile memory transistor according to claim 20, further comprising forming the second voltage-type transistor in at least one circuit selected from a group consisting of a Y-gate, a sense amplifier, an input/output buffer, an X-address decoder, a Y-address decoder and an interface circuit.

24. A method for manufacturing a semiconductor device having a non-volatile memory transistor according to claim 20, further comprising forming the third voltage-type transistor in at least one circuit selected from a group consisting of a voltage generation circuit, an erase voltage generation circuit and a step-up voltage circuit.

25. A method for manufacturing a semiconductor device comprising:
- (a) forming a gate insulation layer and a floating gate that compose a portion of a non-volatile memory transistor on a silicon substrate in a memory region;
- (b) forming a first silicon oxide layer on the substrate by a thermal oxidation method and a second silicon oxide layer by a CVD method;
- (c) forming a mask layer defining an opening in a first transistor region, and removing the first and the second silicon oxide layers in the first transistor region while leaving at least one of the first and second silicon oxide layers remaining in a second transistor region;
- (d) forming a silicon oxide layer on the substrate by a thermal oxidation method to form at least a portion of a gate insulation layer of at least a first voltage-type transistor and a second voltage-type transistor;
- (e) forming a conductive layer and etching the conductive layer to define an intermediate insulation layer and a control gate of the non-volatile memory transistor and a gate insulation layer and a gate electrode for the first voltage-type transistor and second voltage-type transistor in the transistor region; and
- (f) forming an impurity diffusion region that forms a source or a drain by doping an N-type impurity or a P-type impurity in a predetermined region of the silicon substrate, wherein the silicon oxide layer formed in the step (d) forms at least part of a gate insulation layer of the first voltage-type transistor and a gate insulation layer of the second voltage-type transistor.

26. A method for forming a device including non-volatile semiconductor memory region with a split-gate structure, comprising:
- forming a source and drain in a substrate;
- forming a gate insulation layer;
- forming a floating gate in contact with said gate insulation layer;
- forming an intermediate insulation layer in contact with a portion of said floating gate, the intermediate insulation layer being adapted to function as a tunnel insulation layer, the intermediate insulation layer formed from at least three insulation layers including a first layer that contacts the floating gate, a second layer, and a third layer that contacts a control gate;
- forming the control gate in contact with the third layer of the intermediate insulation layer, wherein the intermediate insulation layer and the control gate are formed to have a split-gate structure;
- forming a first transistor region operable at a first voltage range adjacent to the non-volatile semiconductor memory region with a split-gate structure;
- forming a second transistor region operable at a second voltage range adjacent to the first transistor region; and
- forming a third transistor region operable at a third voltage range adjacent to the second transistor region;
- wherein the first voltage range, second voltage range, and third voltage range are different.

27. A method as in claim 26, further comprising:
- forming the first transistor region to include a single layer gate insulation layer; and
- forming the second transistor region to include a double layer gate insulation layer.

28. A method as in claim 27, further comprising forming the third transistor region to include a triple layer gate insulation layer.

29. A method as in claim 26, further comprising forming the first, second and third transistor regions to include gate insulation layers of different thickness.

30. A method as in claim 26, further comprising forming the third transistor region to include a gate insulation layer having first, second and third insulating layers that are formed at the same time as the first, second and third insulating layers of the intermediate insulation layer.

* * * * *